United States Patent
Chen et al.

(10) Patent No.: US 6,885,586 B2
(45) Date of Patent: Apr. 26, 2005

(54) SELF-ALIGNED SPLIT-GATE NAND FLASH MEMORY AND FABRICATION PROCESS

(75) Inventors: Chiou-Feng Chen, Hsinchu (TW); Der-Tsyr Fan, Hsinchu (TW); Jung-Chang Lu, Hsinchu (TW); Prateep Tuntasood, Santa Clara, CA (US)

(73) Assignee: Actrans System Inc., Hsinchu (TW)

( * ) Notice: Subject to any disclaimer, the term of this patent is extended or adjusted under 35 U.S.C. 154(b) by 137 days.

(21) Appl. No.: 10/251,664

(22) Filed: Sep. 19, 2002

(65) Prior Publication Data

US 2004/0057286 A1 Mar. 25, 2004

(51) Int. Cl.[7] ............................................. G11C 7/00
(52) U.S. Cl. ............................ 365/185.17; 365/185.05; 365/185.11; 365/63
(58) Field of Search .................... 365/185.17, 185.05, 365/185.11, 63

(56) References Cited

U.S. PATENT DOCUMENTS

| | | | | |
|---|---|---|---|---|
| 4,959,812 A | | 9/1990 | Momodomi et al. | |
| 5,050,125 A | | 9/1991 | Momodomi et al. | |
| 5,197,027 A | * | 3/1993 | Challa | 365/185.16 |
| 5,541,130 A | * | 7/1996 | Ogura et al. | 438/257 |
| 6,034,894 A | * | 3/2000 | Maruyama et al. | 365/185.17 |
| 6,091,104 A | * | 7/2000 | Chen | 257/326 |
| 6,115,287 A | * | 9/2000 | Shimizu et al. | 365/185.17 |
| 6,291,297 B1 | | 9/2001 | Chen | |
| 6,498,377 B1 | * | 12/2002 | Lin et al. | 257/411 |
| 6,503,785 B1 | * | 1/2003 | Chen | 438/211 |
| 6,747,310 B1 | * | 6/2004 | Fan et al. | 257/320 |
| 2004/0130947 A1 | * | 7/2004 | Fan et al. | 365/185.05 |

* cited by examiner

*Primary Examiner*—Viet Q. Nguyen
(74) *Attorney, Agent, or Firm*—Edward S. Wright

(57) ABSTRACT

Self-aligned split-gate NAND flash memory cell array and method of fabrication in which a series of self-aligned split cells are formed between a bit line diffusion and a common source diffusion. Each cell has control and floating gates which are stacked and self-aligned with each other, and a third gate which is split from but self-aligned with the other two. In some disclosed embodiments, the split gates are utilized as erase gates, and in others they are utilized as select gates. The memory cells are substantially smaller than prior art cells, and the array is biased so that all of the memory cells in it can be erased simultaneously, while programming is bit selectable.

69 Claims, 28 Drawing Sheets

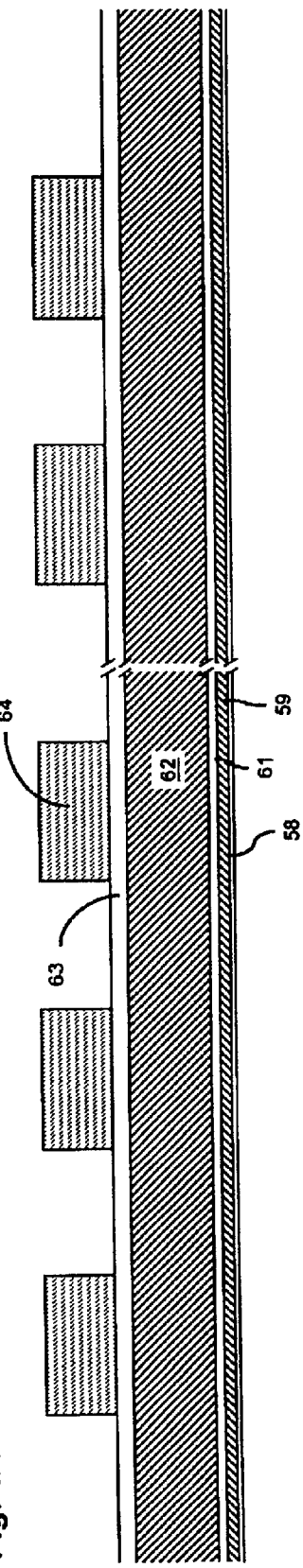
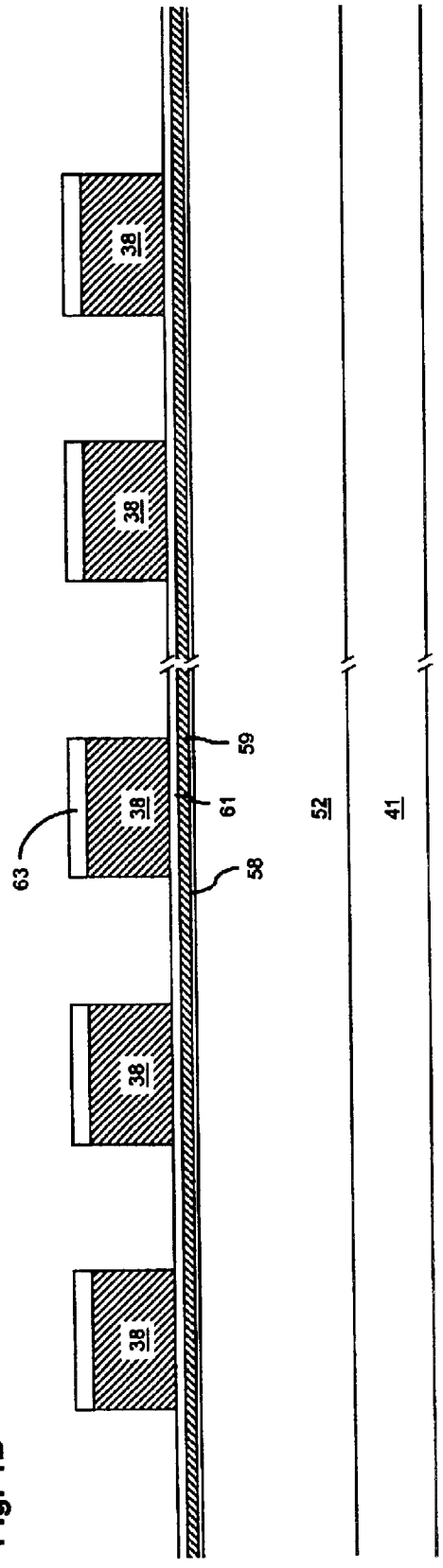
Fig. 4A
Fig. 4B

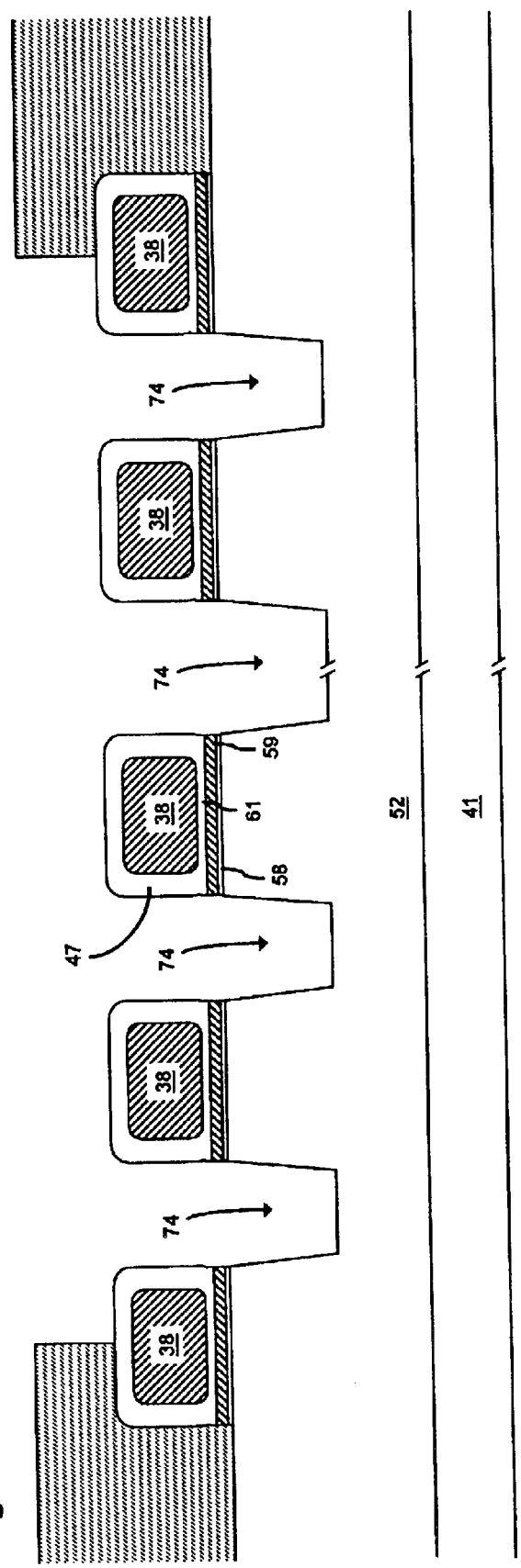

SELF-ALIGNED SPLIT-GATE NAND FLASH MEMORY AND FABRICATION PROCESS

BACKGROUND OF THE INVENTION

1. Field of Invention

This invention pertains generally to semiconductor memory devices and, more particularly, to a self-aligned split-gate NAND flash memory and process of fabricating the same.

2. Related Art

Nonvolatile memory is currently available in several forms, including electrically programmable read only memory (EPROM), electrically erasable programmable read only memory (EEPROM), and flash EEPROM. Flash memory has been widely used for high volume data storage in devices such as memory cards, personal digital assistants (PDA's) and MP3 players. Such applications require high density memory, with smaller cell size and reduced cost of manufacture.

In general, there are two basic types of nonvolatile memory cell structures: stack-gate and split-gate. The stack-gate memory cell usually has a floating gate and a control gate, with the control gate being positioned directly above the floating gate. In a split-gate cell the control gate is still positioned above the floating gate, but it is offset laterally from it. The fabrication process for a stack-gate cell is generally simpler than that for a split-gate cell. However, a stack-gate cell has an over-erase problem which a split-gate cell does not have. This problem is commonly addressed by maintaining the threshold voltage of the cell in a range of about 1.0–2.0 volts after an erase cycle, which adds complexity to the circuit design.

Although a split-gate memory cell has no over-erase problem, it generally includes an additional gate known as a select gate. Such cells are typically fabricated in double-poly or triple-poly processes which involve relatively complex processing steps. In addition, split-gate cells are generally larger than stack-gate cells. Nevertheless, because of the relatively simple circuit design which is possible when there is no over-erase problem, split-gate cells are used widely, particularly in embedded nonvolatile memory applications.

A split-gate memory cell of relatively small size, with efficient erase performance and a small programming current is described in U.S. Pat. Nos. 6,091,104 and 6,291,297.

Cell size has also been reduced in a NAND EPROM array having a series of stack-gate flash memory cells connected in series between a bit-line and a source line, with only one bit-line contact, as illustrated in FIG. 1 and described in greater detail in U.S. Pat. Nos. 4,959,812 and 5,050,125. In this array, a plurality of stack-gate memory cells 21 are connected in series between a bit line diffusion 22 and a source line 23. The cells are formed above a P-well 24 in a substrate 26 of either N- or P-type silicon. Each of the cells has a floating gate 27 fabricated of a conductive material such as polysilicon and a control gate 28 fabricated of a conductive material such as polysilicon or polycide. The control gate is above and in vertical alignment with the floating gate.

Two select gates 29, 31 are included in the array, one near the bit line contact 32 and one near source diffusion 23. Diffusions 33 are formed in the substrate between the stacked gates and between the stacked gates and the select gates to serve as source and drain regions for the transistors in the memory cells. The bit line and diffusions are doped with N-type dopants.

To erase the memory cell, a positive voltage of about 20 volts is applied between the P-well and the control gates, which causes electrons to tunnel from the floating gates to the channel regions beneath them. The floating gates thus become positively charged, and the threshold voltage of the stack-gate cells becomes negative.

To program the memory cells, the control gates are biased to a level of about 20 volts positive relative to the P-well. As electrons tunnel from the channel region to the floating gates, the floating gates are negatively charged, and the threshold voltage of the stack-gate cells becomes positive. By changing the threshold voltage of a stack-gate cell, the channel beneath it can be in either a non-conduction state (logical "0") or a conduction state (logical "1") when a zero voltage is applied to the control gate during a read operation.

OBJECTS AND SUMMARY OF THE INVENTION

It is in general an object of the invention to provide a new and improved semiconductor device and process for fabricating the same.

Another object of the invention is to provide a semiconductor device and process of the above character which overcome the limitations and disadvantages of the prior art.

These and other objects are achieved in accordance with the invention by providing a self-aligned split-gate NAND flash memory cell array and method of fabrication in which a series of self-aligned split-gate cells are formed between a bit line diffusion and a common source diffusion. Each cell has control and floating gates which are stacked and self-aligned with each other, and a third gate which is split from but self-aligned with the other two. Select gates positioned near the bit line and source diffusions are also split from and self-aligned with the stacked control and floating gates at the ends of the series.

In one disclosed embodiment, the split gates are used as erase gates, with heavily doped diffusion regions under them. The erase path is from the rounded side edge of the floating gate to the corresponding erase gate, and the program path is from the channel region to the floating gate above it, with Fowler-Nordheim tunneling along both paths. The array is biased so that all of the memory cells in it can be erased simultaneously, while programming is bit selectable.

In a second disclosed embodiment, the split gates are used as select gates, and each of them has a channel region beneath it. The erase path is from the rounded side edge of the floating gate to the corresponding select gate, with Fowler-Nordheim tunneling, and the program path is from the off-gate channel region between the floating gates to the floating gates, using hot carrier injection. This array is also biased so that all of the memory cells in it can be erased simultaneously, while programming is bit selectable.

In a third disclosed embodiment, shallow trenches are formed in an active region between the bit line and common source. The split gates are used as select gates which extend into the trenches between adjacent control gates. These select gates have two channel regions along the side walls of the trenches and a heavily doped diffusion region near the bottom of the trench. The erase path is from the rounded side edge of the floating gate to the corresponding select gate, with Fowler-Nordheim tunneling. The program path is either from the channel region to the floating gate above it, with Fowler-Nordheim tunneling, or from the off-gate channel region to the floating gate near it, using hot carrier injection. This array is also biased so that all of the memory cells in the array can be erased simultaneously, while programming is bit selectable.

BRIEF DESCRIPTION OF THE DRAWINGS

FIGS. 4A–4H are schematic cross-sectional views illustrating the steps in one embodiment of a process for fabricating a NAND flash memory cell array in accordance with the invention.

FIGS. 11A–11L are schematic cross-sectional views illustrating the steps in one embodiment of a process for fabricating the NAND flash memory cell array of FIG. 9.

DETAILED DESCRIPTION

Figure 1:
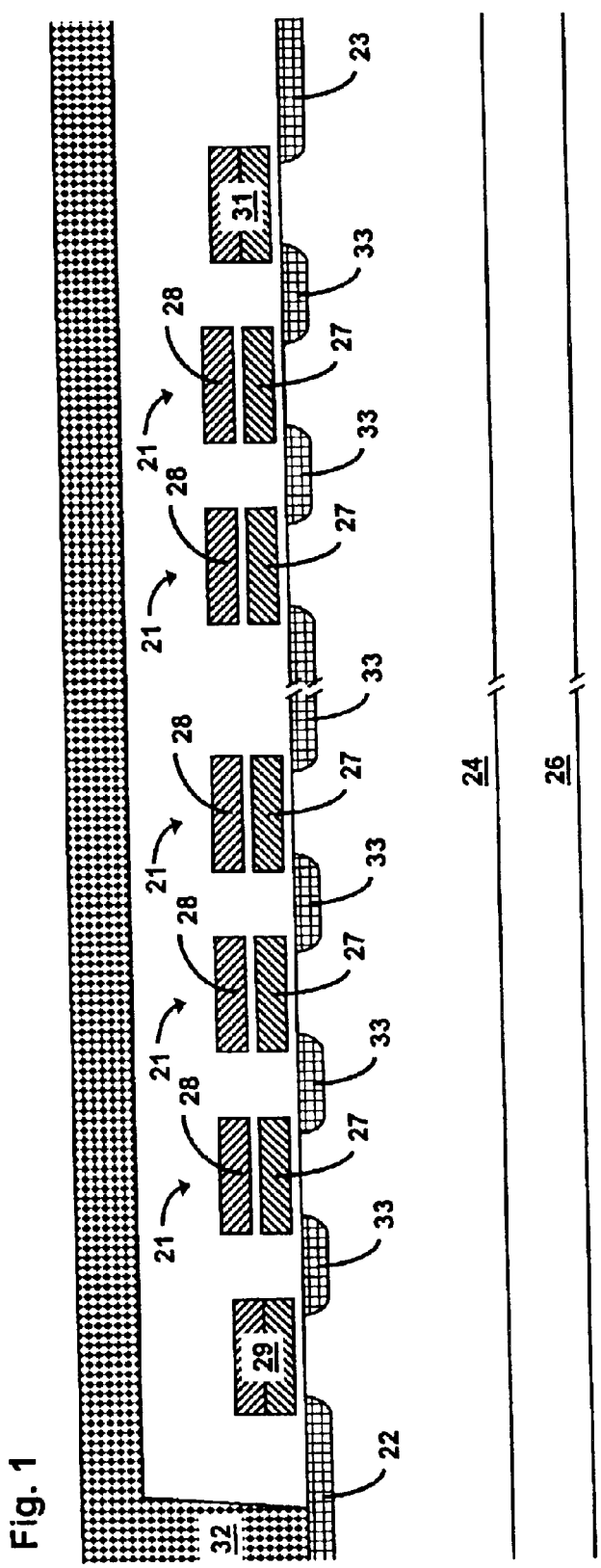
FIG. 1 is a cross-sectional view of a NAND flash memory array with a series of prior art stack-gate flash memory cells.
Figure 2:
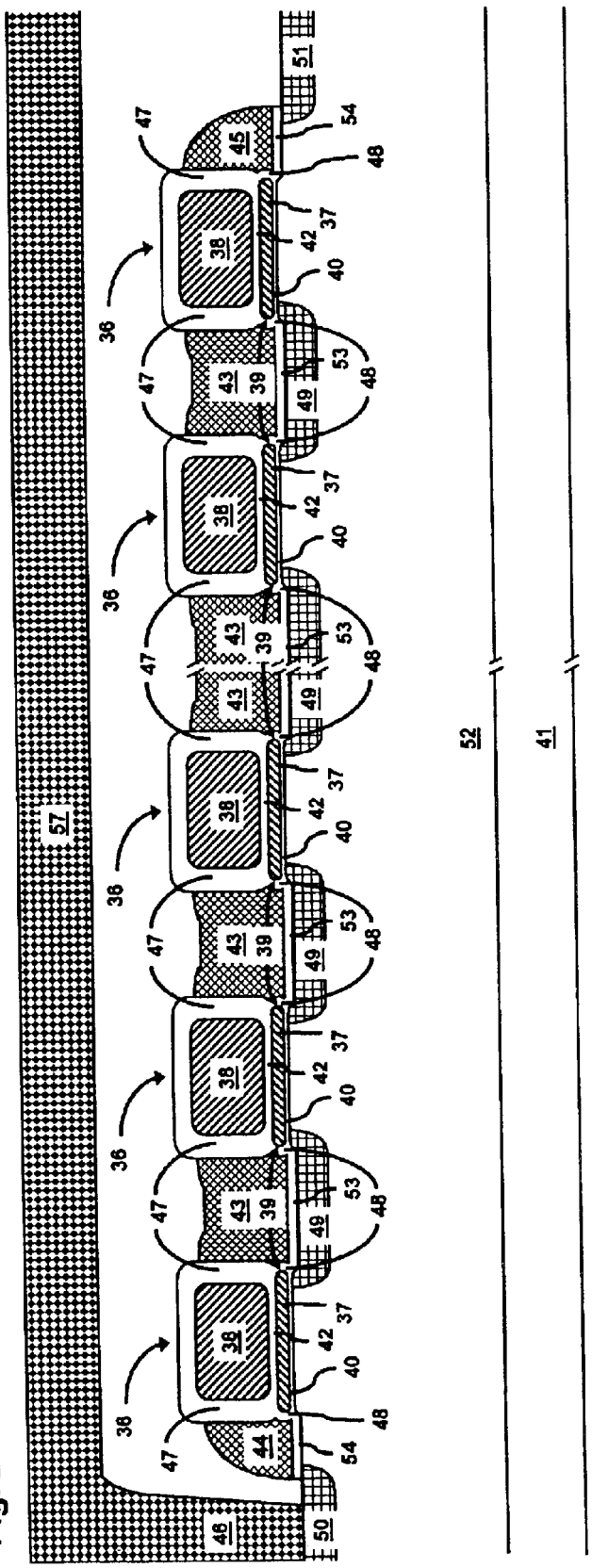
FIG. 2 is a cross-sectional view, taken along line 2—2 in FIG. 3, of one embodiment of a self-aligned split-gate NAND flash memory cell array incorporating the invention.
Figure 3:
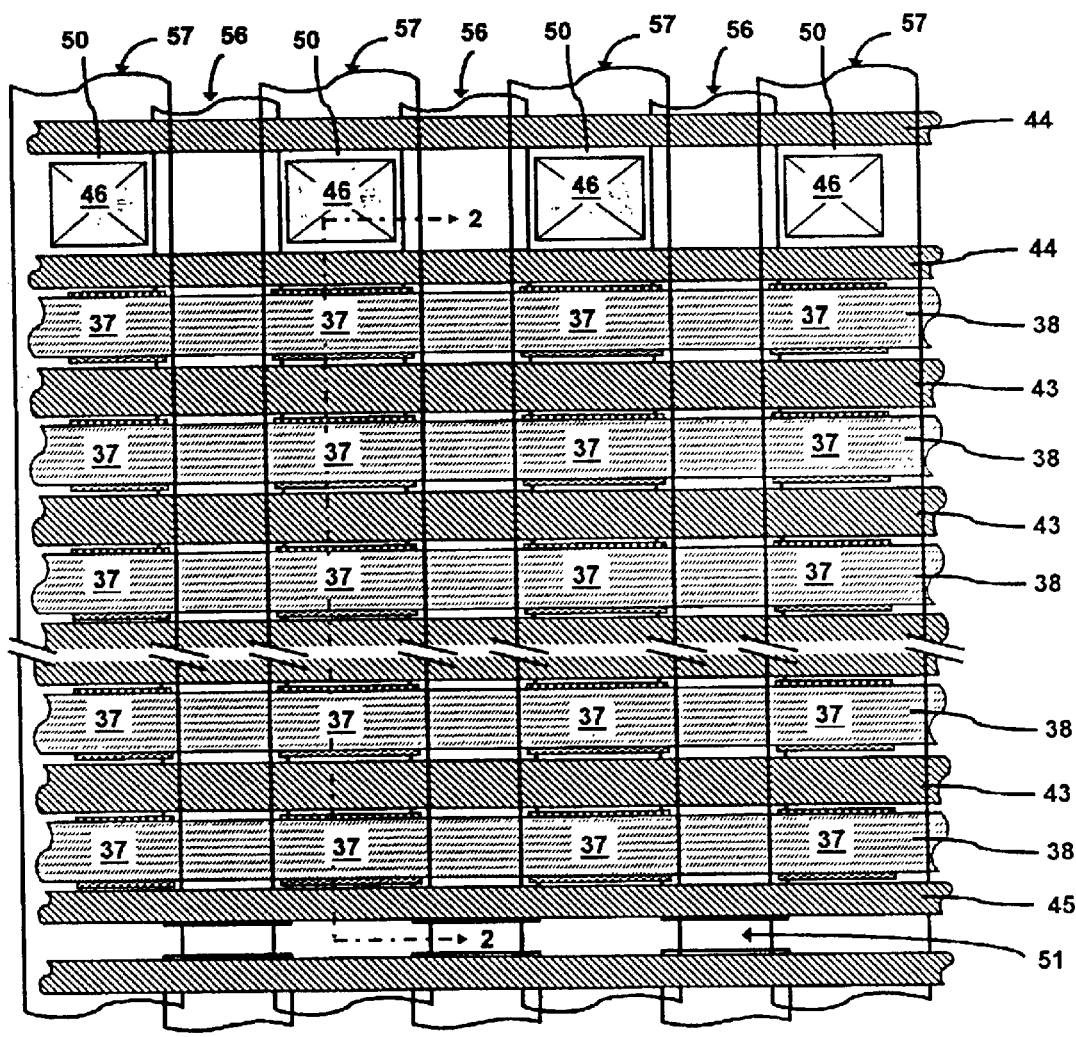
FIG. 3 is a top plan view of the embodiment of FIG. 2.

As illustrated in FIGS. 2 and 3, the memory includes an array of split-gate NAND flash memory cells 36, each of which has a floating gate 37 and a control gate 38 which is positioned above and in vertical alignment with the floating gate.

The floating gates are fabricated of a conductive material such as polysilicon or amorphous silicon, with a preferred thickness on the order of 100 Å–1000 Å. The side edges 39 of the floating gates have a rounded curvature, and a thin gate insulator 40, typically a thermal oxide, is provided between each of the floating gates and the silicon substrate 41 beneath it.

The control gates are narrower in horizontal dimension and thicker in vertical dimension than the floating gates, with the edges of the floating gates extending laterally beyond the edges of the control gates. The control gates are fabricated of a conductive material such as a doped polysilicon or polycide, and each of the control gates is insulated from the floating gate beneath it by a dielectric film 42. That film can be either a pure oxide or a combination of oxide, nitride and oxide (ONO), and in one presently preferred embodiment, it consists of a layer nitride between two layers of oxide.

Erase gates 43 are positioned between stack-gate cells 36, and a select gate 44 is positioned between the cell at one end of the group and bit line contact 46. A second select gate 45 is positioned between the cell at the other end of the group and source diffusion 51. These gates are fabricated of a conductive material such as a doped polysilicon or polycide. They are self-aligned and parallel to the adjacent control gates and floating gates, with a thick dielectric film 47 separating each erase or select gate from the adjacent control gate and a thin tunnel oxide 48 separating it from the floating gate. Both the dielectric film and the tunnel oxide can be either a pure thermal oxide or a combination of thermal oxide, a CVD oxide, and/or a CVD nitride.

Diffusion regions 49, a bit line diffusion 50, and a common source diffusion 51 are formed in a P-type well 52 in the upper portion of substrate 41 and doped with an N-type material. Diffusion regions 49 are positioned directly beneath the erase gates, and bit line diffusion 50 is partially overlapped by the select gate at one end of the array. Common source diffusion region 51 is partially overlapped by select gate 45 and is shared by this array of cells and by another array (not shown) of the same type.

Erase gates 43 and select gates 44, 45 are separated from the diffusion regions and the substrate by gate oxides 53, 54. These layers can be either a pure thermal oxide or a combination of thermal oxide and CVD oxide.

In this embodiment, an erase path is formed between the rounded side edges 39 of the floating gate through tunnel oxide 48 to the adjacent erase gate 43.

As best seen in FIG. 3, erase gates 43 and select gates 44, 45 are parallel to the control gates 38, which cross over the alternating floating gates 37 and isolation regions 56 in adjacent rows of cells. Bit lines 57 are perpendicular to those gates, and cross over the bit line contact 46, select gate 44, control gates 38, erase gates 43, select gate 45, and common source regions 51 in each row of the array.

The memory cell array of FIGS. 2 and 3 can be fabricated by the process illustrated in FIGS. 4A through 4H. In this process, an oxide layer 58 is thermally grown to a thickness of about 70 Å–150 Å on a monocrystalline silicon substrate. In the embodiment illustrated, the silicon is in the form of a P-type substrate 41 in which a P-type well 52 is formed. Alternatively, if desired, a P-type well can be formed in an N-type well in the P-type substrate.

A conductive layer 59 of polysilicon or amorphous silicon (poly-1) is deposited on the thermal oxide to a thickness on the order of 100 Å–1000 Å, and a dielectric layer 61 (the inter-poly dielectric) is formed on the silicon. This silicon is preferably doped with phosphorus, arsenic or boron to a level on the order of $10^{17}$ to $10^{20}$ per $cm^3$. The doping can be done in-situ during deposition of the silicon or by ion implantation directly into the silicon or through the dielectric 61 above it.

The inter-poly dielectric can be either a pure oxide or a combination of oxide, nitride and oxide (ONO), and in the embodiment illustrated, it consists of a lower oxide layer having a thickness on the order of 30 Å–100 Å, a central nitride layer having a thickness on the order of 60 Å–300 Å, and an upper oxide layer having a thickness on the order of 30 Å–100 Å.

A second layer of polysilicon 62 (poly-2) is deposited on dielectric film 61, and is subsequently etched to form the control gates 38. This layer has a thickness on the order of 1500 Å–3500 Å, and is doped with phosphorus, arsenic or boron to a level on the order of $10^{20}$ to $10^{21}$ per $cm^3$.

A CVD oxide or nitride layer 63 having a thickness on the order of 300 Å–1000 Å is deposited on the poly-2 layer, and is used as a mask to prevent the poly-2 material from etching away during subsequent dry etching steps.

A photolithographic mask 64 is formed over layer 63 to define the control gates, and the unmasked portions of that layer and the poly-2 layer etched away anisotropically, leaving only the portions of the poly-2 which form the control gates 38, as illustrated in FIG. 4B.

Figure 4C:
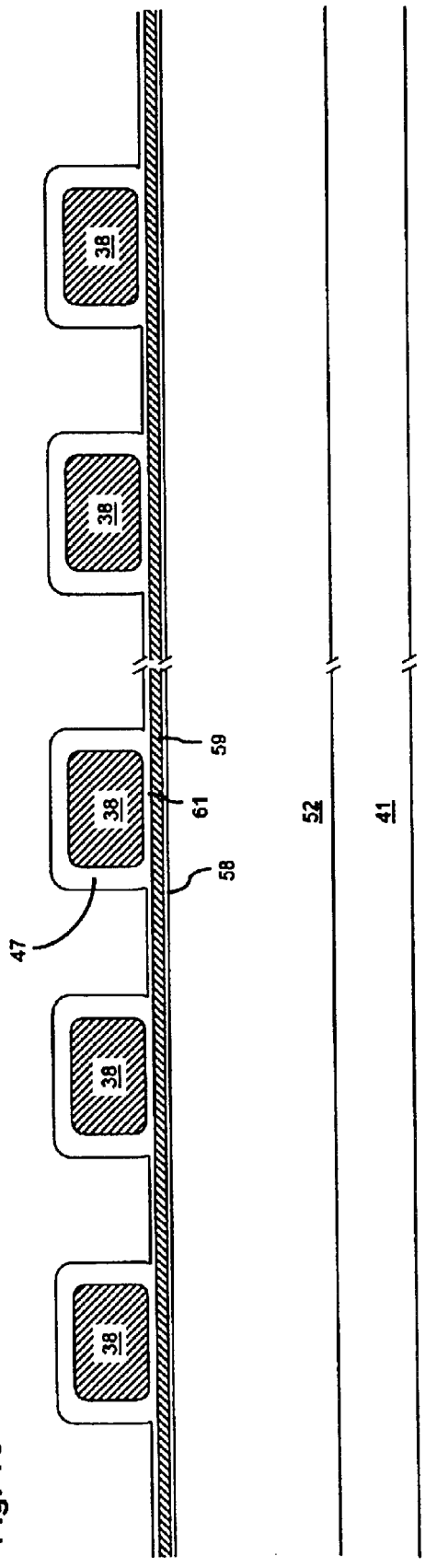

The photoresist is then stripped away, and oxide 47 is thermally grown on the side walls of the control gates to a thickness on the order of 200 Å–700 Å, as shown in FIG. 4C.

Figure 4D:
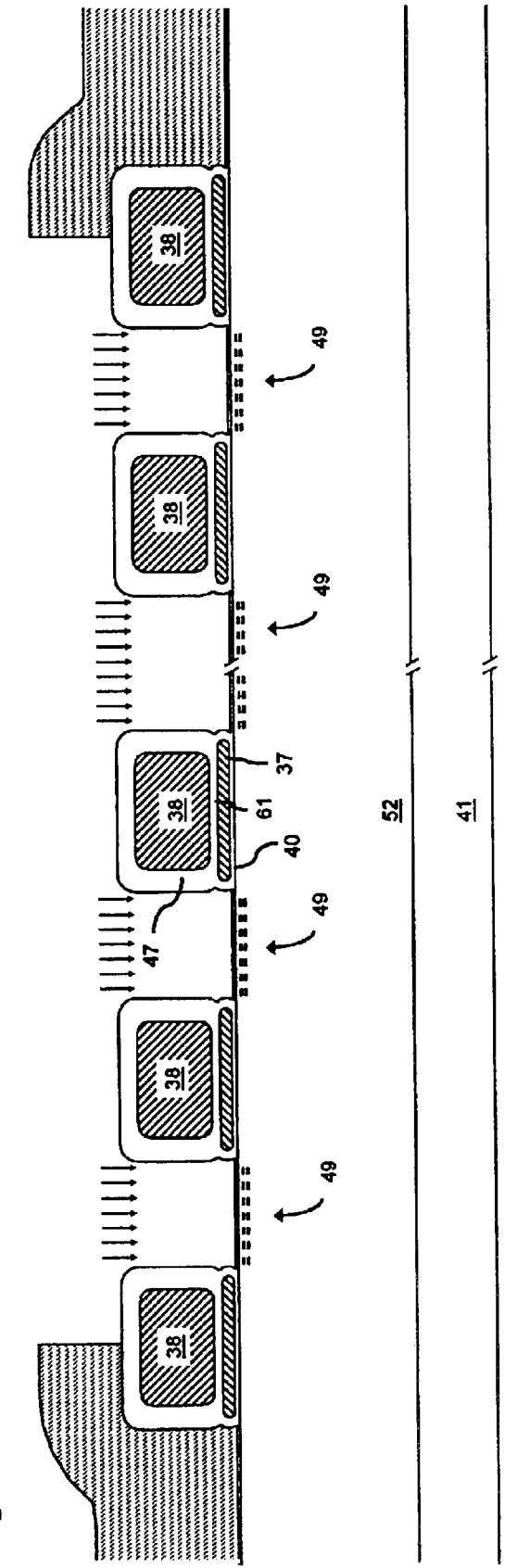

Using the oxide 47 as a mask, the exposed portions of the inter-poly dielectric 61 and the underlying portions of the poly-1 layer 59 are etched away anisotropically to form the floating gates, with only a thin layer of oxide 58 being left on the surface of substrate between the gates, as illustrated in FIG. 4D.

Diffusion regions 49 are then formed in the substrate between the gates by ion implantation, using dopants such as $P^{31}$ or $As^{75}$, as illustrated in FIG. 4D.

Figure 4E:
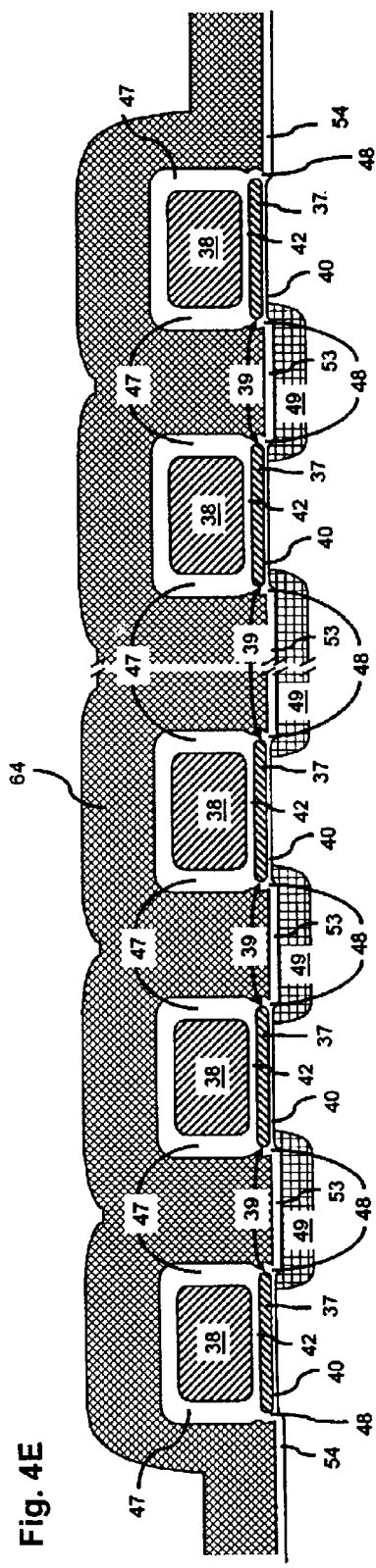

Following ion implantation, another thermal oxidation is performed, which builds up gate oxide 54 for the select gate, tunnel oxide 48, thermal oxide 53 on diffusion regions 49, and the oxide 47 surrounding the poly-2 control gates, as shown in FIG. 4E. Gate oxide 54 is thus built up to a thickness on the order of 100 Å–400 Å, and tunnel oxide 48 is built up to a thickness on the order of 100 Å–300 Å.

To improve the quality of the oxide films and reduce disturbances between the select gate and/or the erase gates and the floating gates, a thin CVD oxide of about 50 Å–200 Å can be deposited before or after thermal oxidation.

During thermal oxidation, the side edges 39 of floating gates 37 become rounded because the oxidation rate of the polysilicon is faster near the interface between it and the dielectric materials above and below it. The rounded curvature results in an electric field enhancement which facilitates electron tunneling from the floating gates to the erase gates. Moreover, the rounding of the side edges eliminates the localized trapping effect that occurs in the tunnel oxide near the square corners of a floating gate when a cell operates in erase mode and the electrons tunnel from the floating gate to the erase gate. Thus, the rounded edges enhance the program-and-erase performance of the memory cells.

As a result of these processing steps, each of the control gates is self-aligned to the floating gate beneath it, and the control gate is narrower than the floating gate. Therefore, the edges of the floating gate extend laterally beyond the edges of the control gate.

Following thermal oxidation, a conductive layer (poly-3) 65 is deposited over the entire wafer, as illustrated in FIG. 4E. This layer is typically doped polysilicon or polycide, and it is deposited to a thickness on the order of 1500 Å–4000 Å.

Figure 4F:
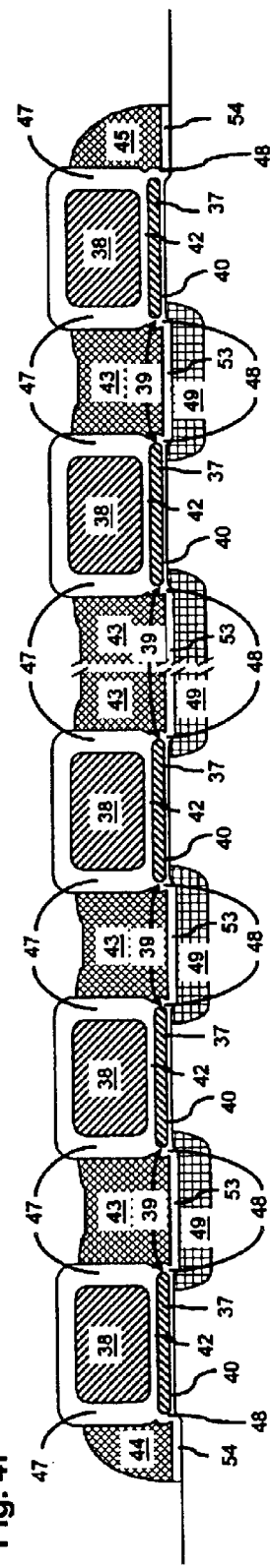

The poly-3 layer is then etched anisotropically, leaving only the portions of it which form erase gates 43 and select gates 44, 45, as illustrated in FIG. 4F. Being formed in this manner, the erase gates and the select gate are self-aligned and parallel to the control gates.

Figure 4G:
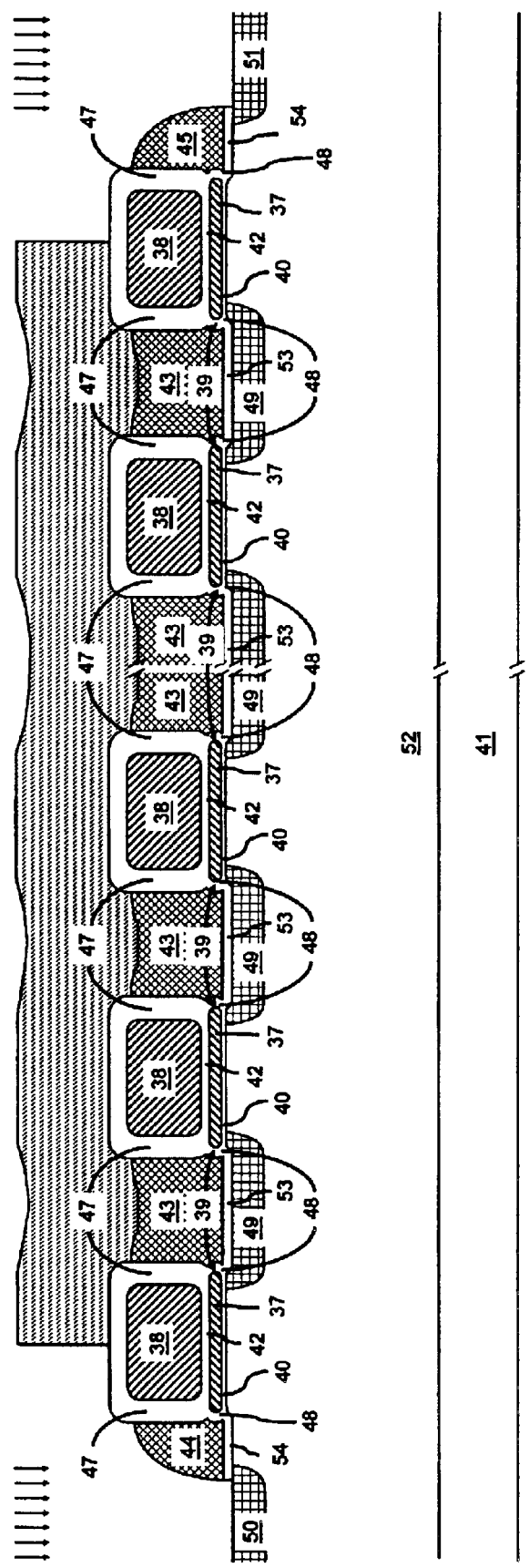
Figure 4H:
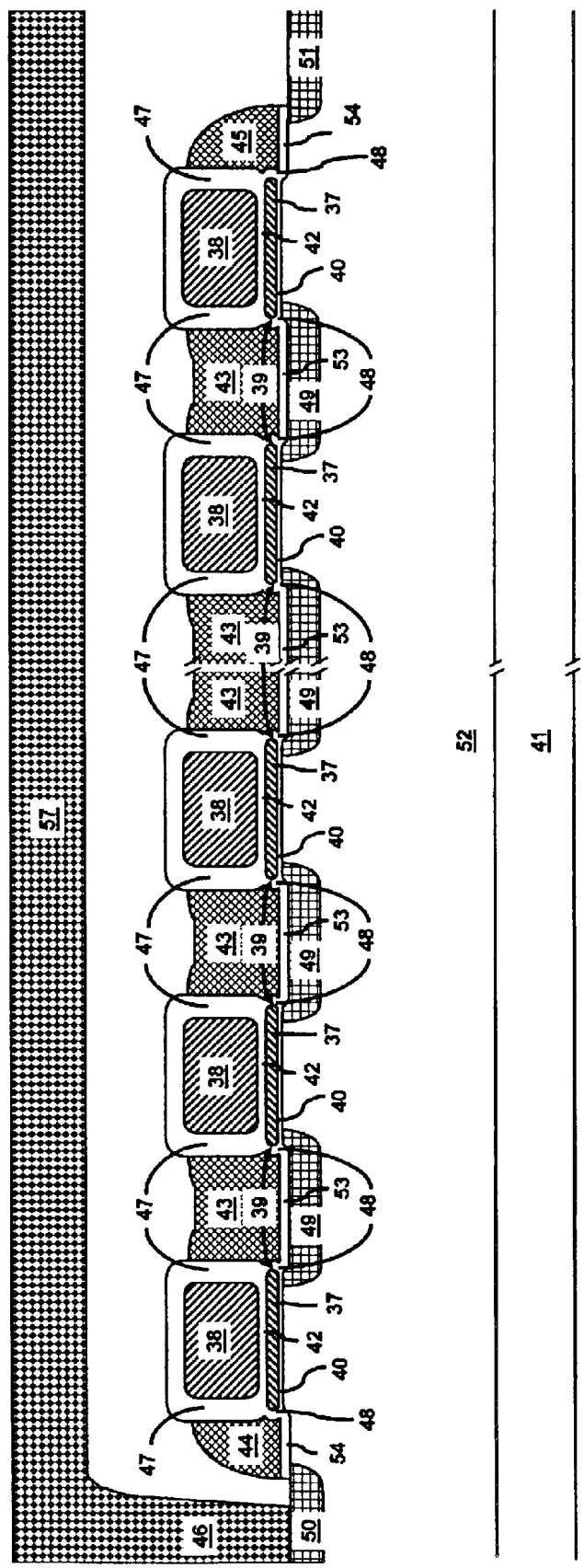

N-type dopants such as $P^{31}$ or $As^{75}$ are implanted into P-well 52 to form bit line diffusion 50 and common source diffusion 51, as illustrated in FIG. 4G.

Thereafter, a glass material 66 such as phosphosilicate glass (PSG) or borophosphosilicate glass (BPSG) is deposited across the entire wafer, then etched for bit line contacts 46. Finally, a metal layer is deposited over the glass and patterned to form bit lines 57 and bit line contacts 46.

Figure 5A:
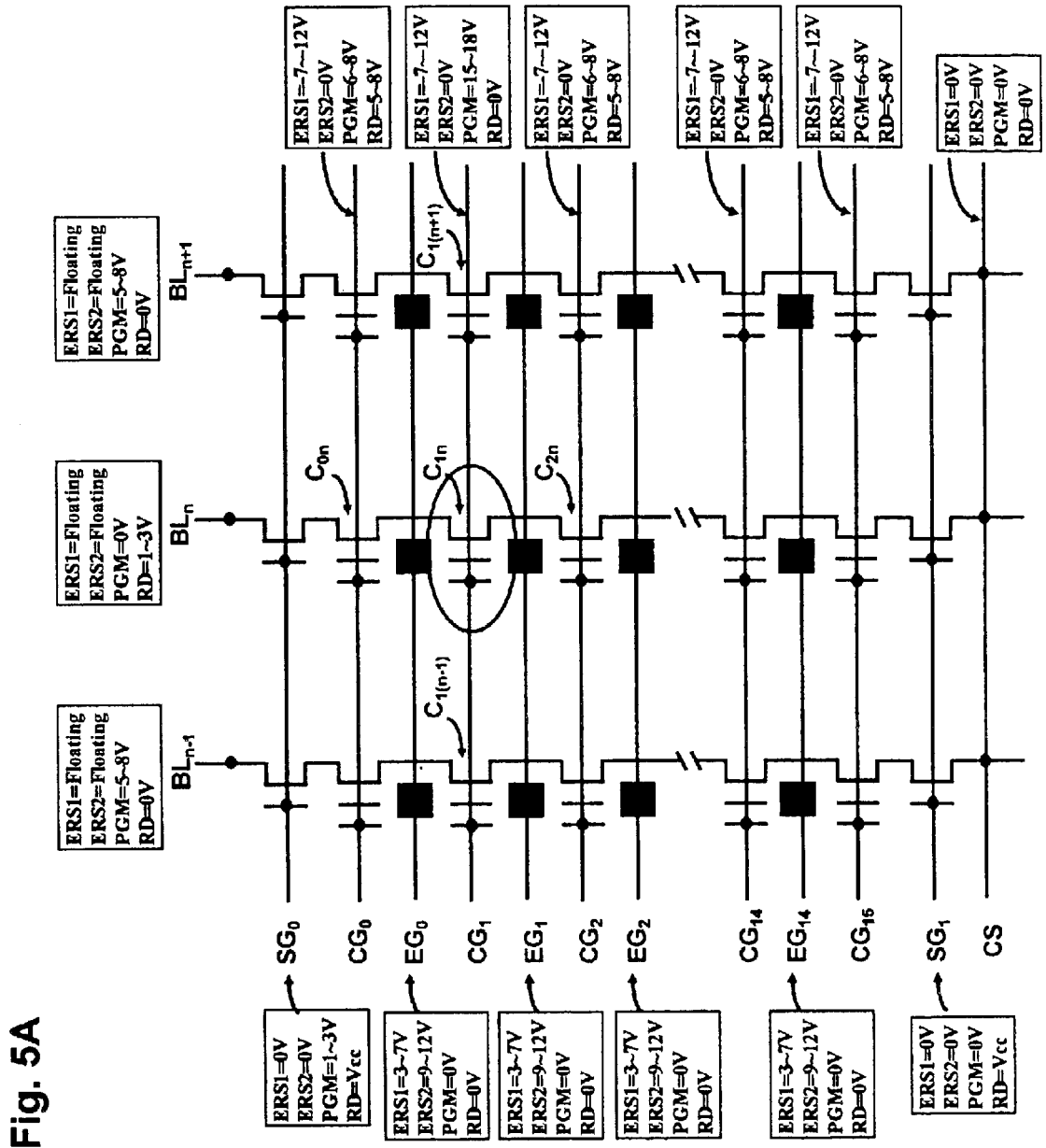
FIGS. 5A and 5B are circuit diagrams of a small memory array as in the embodiment of FIG. 2, showing exemplary bias conditions for erase, program and read operations.

Operation and use of the memory cell array can be described with reference to FIGS. 5A and 5B where exemplary bias voltages for erase (ERS), program (PGM) and read (RD) operations are shown next to the terminals of the array. In this example, memory cell $C1n$ is selected. This cell is located at the intersection of control gate $CG_1$ and bit line BLn, and is encircled on the drawing for ease of location. All of the other memory cells in the array are unselected.

During an erase operation, electrons are forced to tunnel from the floating gate to the erase gate, leaving positive ions in the majority with the floating gate. When the electric field across the tunnel oxide is more than 10 mV/cm, Fowler-Nordheim tunneling becomes significant, and electrons with sufficient energy can tunnel from the cathode electrode (floating gate) to the anode electrode (erase gate).

With the rounded curvature of the floating gate or cathode electrode, the voltage required for Fowler-Nordheim tunneling is reduced by the resulting enhancement in the effective electric field. The enhanced field also makes it possible to use a thicker tunnel oxide while still maintaining sufficient electron tunneling.

Erasing can be done using two different bias conditions. In the first erase mode, the control gate of memory cell is biased at a level on the order of −7 to −12 volts, the erase gate is biased to a level on the order of 3–7 volts, the bit line is kept floating, and the select gates are maintained at 0 volts. In the second erase mode, the control gate of the memory cell is biased at 0 volts, the erase gate is biased to a level on the order of 9–12 volts, the bit line is kept floating, and the common source, select gates and P-well are all biased at 0 volts.

With these bias conditions, most of the voltage applied between the control gate and the erase gate appears across the tunnel oxide surrounding the rounded side edge of the floating gate. That triggers Fowler-Nordheim tunneling, with electrons tunneling from the floating gate to the erase gate. As the floating gate becomes more positively charged, the threshold voltage of the memory cell, which is preferably on the order of −3 to −6 volts in this embodiment, becomes lower. This results in an inversion layer in the channel under the floating gate when the control gate is biased at 0 volts. Therefore, the memory cell goes into the conductive state (logic "1") after the erase operation. In the unselected memory cells, the control gates and the erase gates are biased at 0 volts, with the result that there is no Fowler-Nordheim tunneling during the erase operation.

During a program operation, Fowler-Nordheim tunneling causes electrons to tunnel from the channel region to the floating gate above it, and the floating gate becomes negatively charged. In the example shown in FIG. 5A, a bias of 15–18 volts is applied to the control gate of the selected memory cell $C_{1n}$, 1–3 volts is applied to the select gate $SG_0$, and erase gates $EG_0$–$EG_{14}$, select gate $SG_1$ bit line 57, and common source 51 are maintained at 0 volts. With these bias conditions, most of the applied voltage appears across the gate oxide beneath the floating gate, resulting in Fowler-Nordheim tunneling which causes electrons to migrate from the channel region between the source regions to the floating gate. At the end of the program operation, the floating gate is negatively charged, the threshold voltage of the memory cell, which preferably is on the order of 1–3 volts, becomes higher. Thus, the memory cell is turned off when the control gate is biased at 0 volts during a read operation. Following a program operation, the memory cell goes into a non-conductive state (logic "0").

In the unselected memory cells $C_{1(n-1)}$ and $C_{1(n+1)}$ that share the same control gate with the selected cell $C_{1n}$, the bit line is biased at 5–8 volts, and the control gate is biased at 15–18 volts. This results in negligible Fowler Nordheim tunneling, and the floating gate charges remain unchanged. The other unselected memory cells $C_{0n}$ and $C_{2n}$ are biased with 0 volts on the bit line and 6–8 volts on the control gate. This also minimizes Fowler-Nordheim tunneling, and the charges on the floating gates do not change.

Figure 5B:
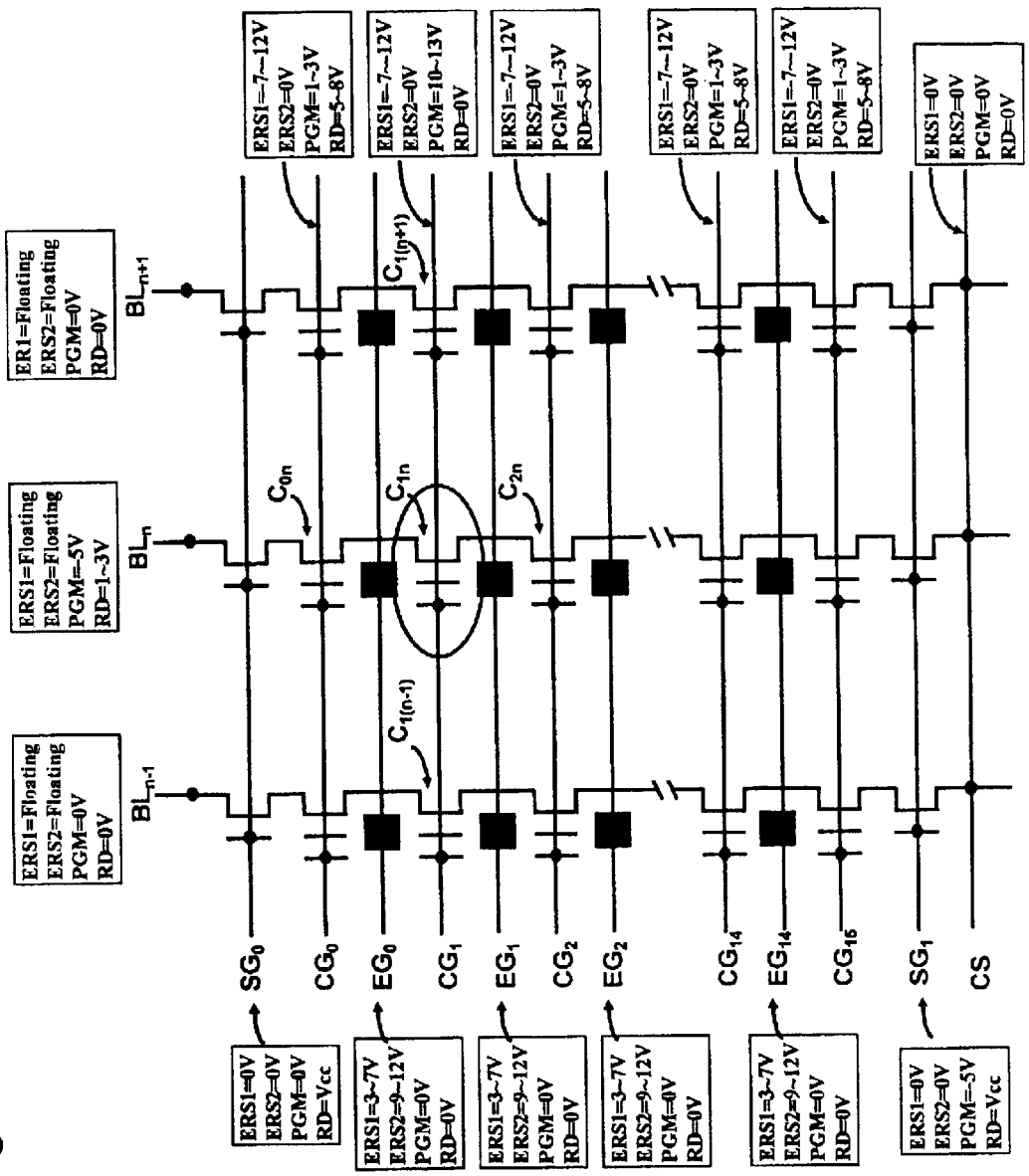

Another set of bias conditions for the program mode is illustrated in FIG. 5B. In this example, the selected memory cell $C_{1n}$ is biased with 10–13 volts on the control gate, 0 volts on select gate $SG_0$, the erase gates, and the common source, and −5 volts on select gate $SG_1$, the bit line, and the P-well. With the cell biased in this manner, most of the applied voltage falls across the gate oxide beneath the floating gate. That results in Fowler-Nordheim tunneling which causes electrons to migrate from the channel region to the floating gate.

In the read mode, the selected memory cell $C_{1n}$ is biased with 0 volts on the control gate, source and erase gates, 1–3 volts on the bit line, and Vcc on the select gates. The unselected memory cells in the bit line direction, e.g. $C_{0n}$ and $C_{2n}$ are turned on by applying 5–8 volts to the control gates. When the memory cell is erased, it shows a conductive state because the channel of selected cell is turned on and the select transistors and the other cells in the same bit line direction are also turned on. Thus, a logic "1" is returned by the sense amplifier.

When the memory cell is programmed, it shows a non-conductive state because the channel of the selected cell is turned off. Thus, a logic "0" is returned by the sense amplifier. In the unselected memory cells $C_{1(n-1)}$ and $C_{1(n+1)}$, both the bit line and the common source are biased at 0 volts, and no current flows between the bit line and the source.

Figure 6:
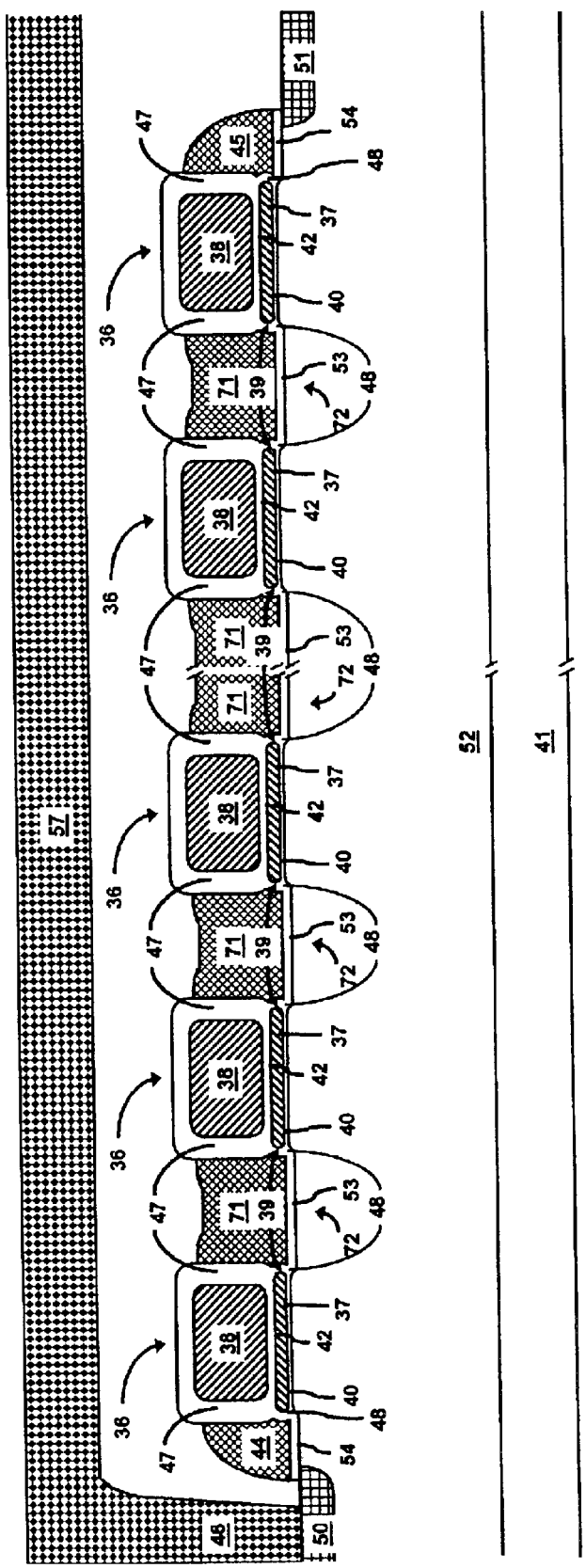
FIG. 6 is a cross-sectional view, taken along line 6—6 in FIG. 7, of another embodiment of a self-aligned split-gate NAND flash memory cell array incorporating the invention.
Figure 7:
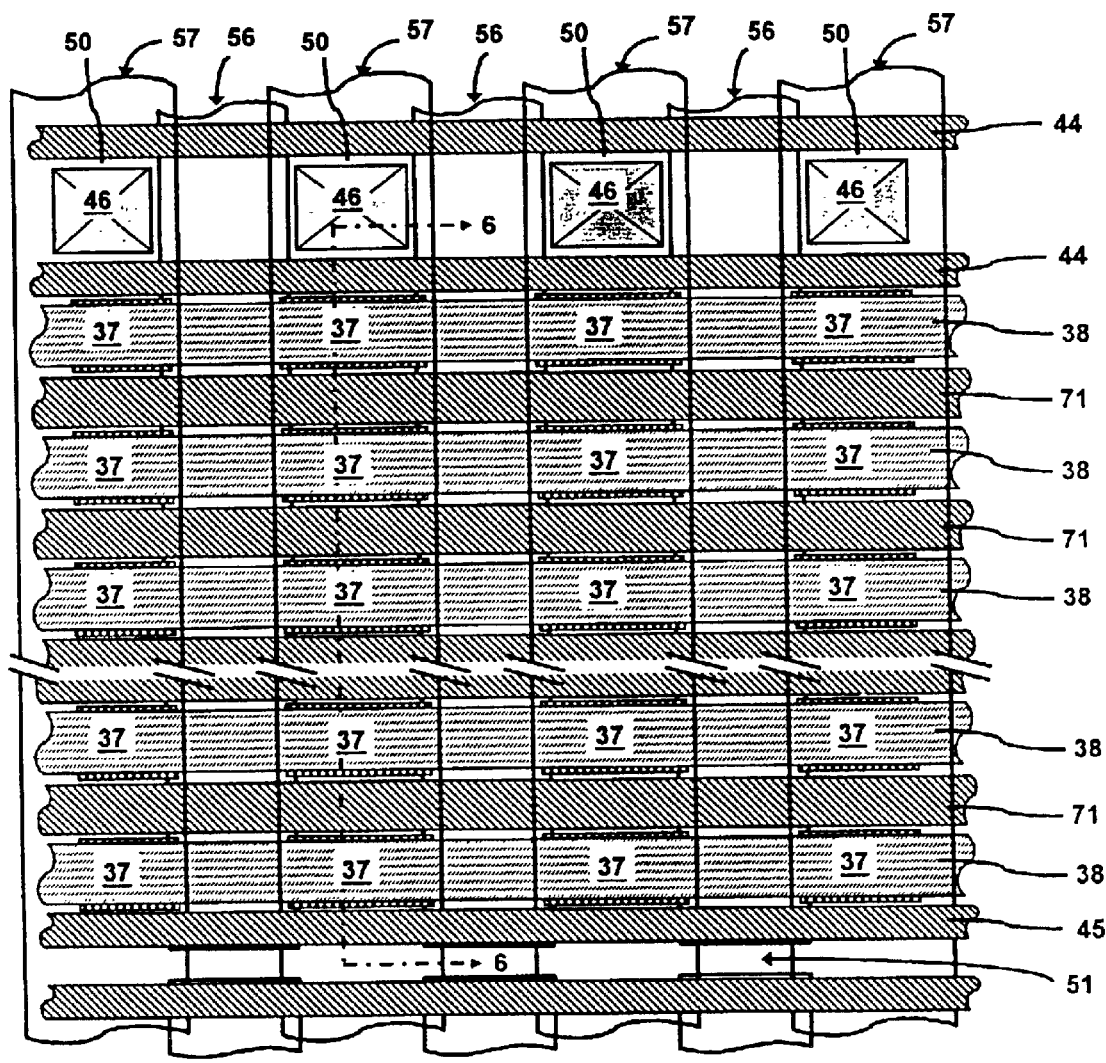
FIG. 7 is a top plan view of the embodiment of FIG. 6.

The embodiment of FIGS. 6 and 7 is generally similar to the embodiment of FIGS. 2 and 3, and like reference numerals designate corresponding elements in the two embodiments. In this embodiment, however, select gates 71 are positioned between the control and floating gate stacks, and there are no diffusions in the substrate beneath the select gates. The select gates are formed in the same manner as erase gates 43 in the embodiment of FIG. 2, and they are thus self-aligned with the stacked control and floating gates. The erase path is from the rounded side edges 39 of the floating gate through tunnel oxide 48 to the adjacent select gate 71.

As best seen in FIG. 7, select gates 44, 45 and 71 are parallel to the control gates 38, which cross over the alternating floating gates 37 and isolation regions 56 in adjacent rows of cells. Bit lines 57 are perpendicular to the select and control gates, and cross over the bit line contact 46, select gates 44, 45 and 71, control gates 38, and common source regions 51 in each row of the array.

The process of fabricating the NAND flash memory cell array in the embodiment of FIG. 6 is similar to that shown in FIGS. 4A through 4H with the exception that there are no diffusion regions beneath select gates 71. Hence, in this embodiment, the portions 72 of the P-well 52 beneath select gates 57 are used as the channels for those gates.

Figure 8:
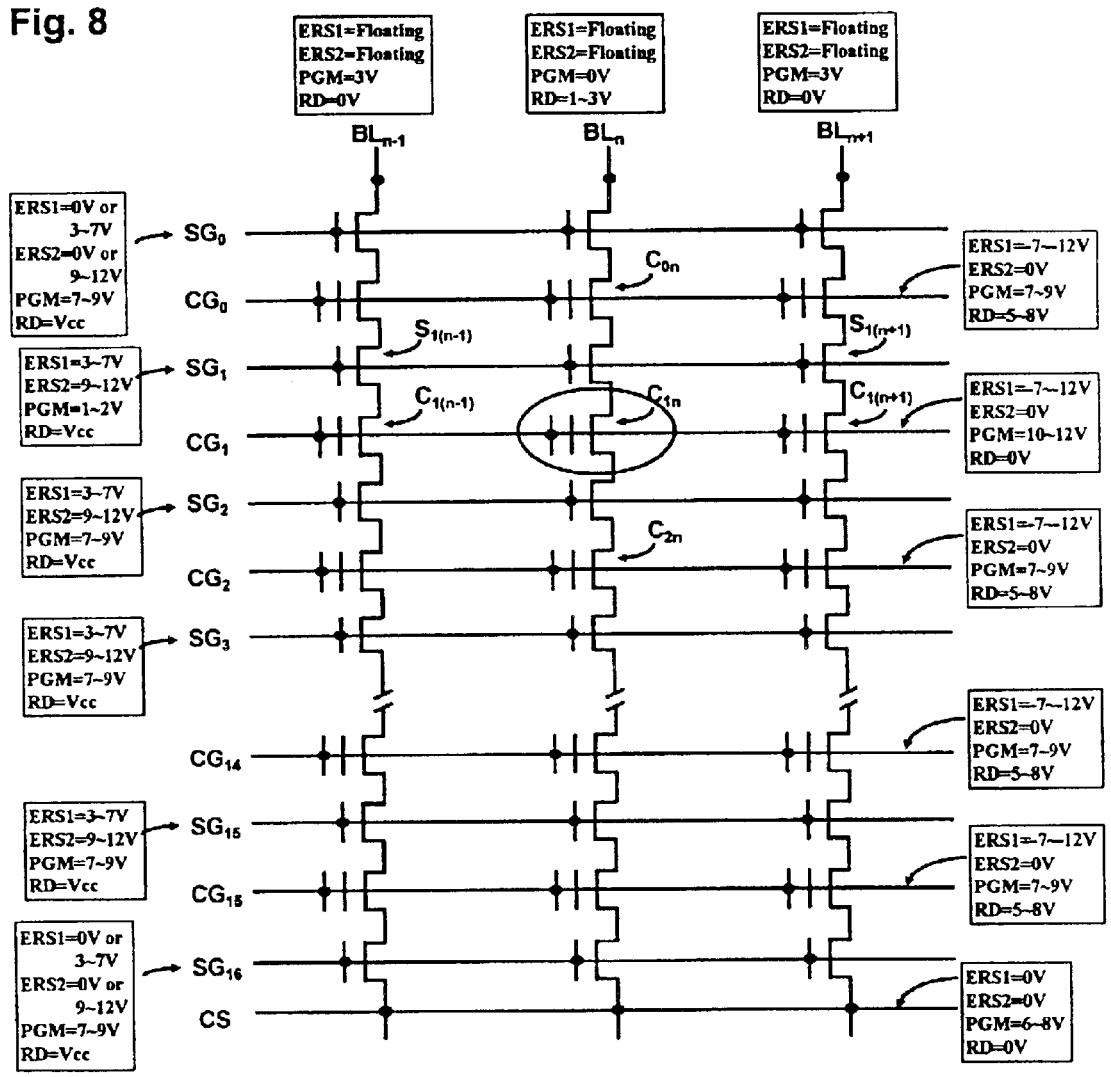
FIG. 8 is a circuit diagram of a small memory array as in the embodiment of FIG. 6, showing exemplary bias conditions for erase, program and read operations.

Operation and use of the embodiment of FIGS. 6 and 7 can be described with reference to FIG. 8 where exemplary bias voltages for erase (ERS), program (PGM) and read (RD) operations are shown next to the terminals of the array. As in the example of FIG. 5A, memory cell C1n is once again assumed to be selected. This cell is located at the intersection of control gate $CG_1$ and bit line BLn, and is encircled on the drawing for ease of location. All of the other memory cells in the array are unselected.

Erasing can be done with either of two different bias conditions. In the first erase mode, the control gate of the memory cell is biased at −7 to −12 volts, select gates $SG_1$–$SG_{15}$ are biased at 3–7 volts, select gates $SG_0$ and $SG_{16}$ are biased either at 0 volts or at 3–7 volts, the bit line is floating, and the common source is biased at 0 volts. In the second erase mode, the control gate, P-well and common source are biased at 0 volts, select gates $SG_1$–$SG_{15}$ are biased at 9–12 volts, select gates $SG_0$ and $SG_{16}$ are biased either at 0 volts or at 9–12 volts, and the bit line is floating.

With these bias conditions, most of the voltage difference between the control gate and the select gate appears across the tunnel oxide surrounding the rounded sidewall of floating gate. That triggers Fowler-Nordheim tunneling, with electrons tunneling from the floating gate to the select gate. As the floating gate becomes more positively charged, the threshold voltage of the memory cell, which is preferably on the order of −3 to −6 volts, becomes lower. This results in an inversion layer in the channel under the floating gate when the control gate is biased at 0 volts. Therefore, the memory cell goes into the conductive state (logic "1") after the erase operation. In the unselected memory cells, the control gates and the select gates are biased at 0 volts, with the result that there is no Fowler-Nordheim tunneling during the erase operation.

In the program mode, the control gate of the selected memory cell $C_{1n}$ is biased to a level of 10–12 volts, 7–9 volts is applied to select gates $SG_0$, $SG_2$–$SG_{16}$ and to the control gates of the other memory cells in the same bit line direction as the selected cell (e.g. $C_{0n}$ and $C_{2n}$), the bit line is held at 0 volts, and 6–8 volts is applied to the common source. The cells and the select transistors are turned on by applying 7–9 volts to the control gates and to the select gates. The voltage applied to the select gate just before the selected cell ($SG_1$ and $C_{1n}$ in this example) can be on the low side, preferably on the order of 1–2 volts.

With these bias conditions, most of the voltage between the common source and the bit line appears across the mid-channel region between select gate $SG_1$ and the floating gate of the selected cell $C_{1n}$, resulting in a high electric filed in that region. In addition, since the floating gate is coupled to a high voltage from the common source node and the control gate CG1, a strong vertical electric field is established across the oxide between the mid-channel region and the floating gate. When electrons flow from the bit line to the common source during the program operation, they are accelerated by the electric field across the mid-channel region, and some of them become heated. Some of the hot electrons get accelerated by the vertical field, which causes them to overcome the energy barrier of the oxide (about 3.1 eV) and inject into the floating gate.

At the end of the program operation, the floating gate is negatively charged, the threshold voltage of the memory cell, which preferably is on the order of 1–3 volts, becomes higher. Thus, the memory cell is turned off when the control gate is biased at 0 volts during a read operation. Following a program operation, the memory cell goes into a non-conductive state (logic "0").

In the unselected memory cells $C_{1(n-1)}$ and $C_{1(n+1)}$ sharing the same control gate with the selected cell $C_{1n}$, the bit line is biased at 3 volts, the select gate $SG_1$ is at 1–2 volts, and the control gate is at 10–12 volts. Thus, select transistors $S_{1(n-1)}$ and $S_{1(n+1)}$ are turned off, and there is no mid-channel hot carrier injection takes in cells $C_{1(n-1)}$ and $C_{1(n+1)}$. The other unselected memory cells $C_{0n}$ and $C_{2n}$ are biased with 0 volts to the bit line and 7–9 volts to the control gate, which minimizes the mid-channel hot carrier injection, and the floating gate charges are unchanged.

In the read mode, the control gate of the selected memory cell $C_{1n}$ and the common source are biased to 0 volts, 1–3 volts is applied to the bit line, and Vcc is applied to the select gates. The unselected memory cells in the bit line direction, e.g. $C_{0n}$ and $C_{2n}$, are turned on by applying 5–8 volts to their control gates. When the memory cell is erased, the read shows a conductive state because the channel of selected cell is turned on, and the other cells and the select transistors in the same bit line direction also turned on. Thus, a logic "1" is returned by the sense amplifier. When the memory cell is programmed, the read shows a non-conductive state because the channel of the selected cell is turned off, and hence the sense amplifier returns a logic "0". In the unselected memory cells $C_{1(n-1)}$ and $C_{1(n+1)}$, both the bit line and common source nodes are biased at 0 volts, and there is no current flow between the bit line and the common source nodes.

Figure 9:
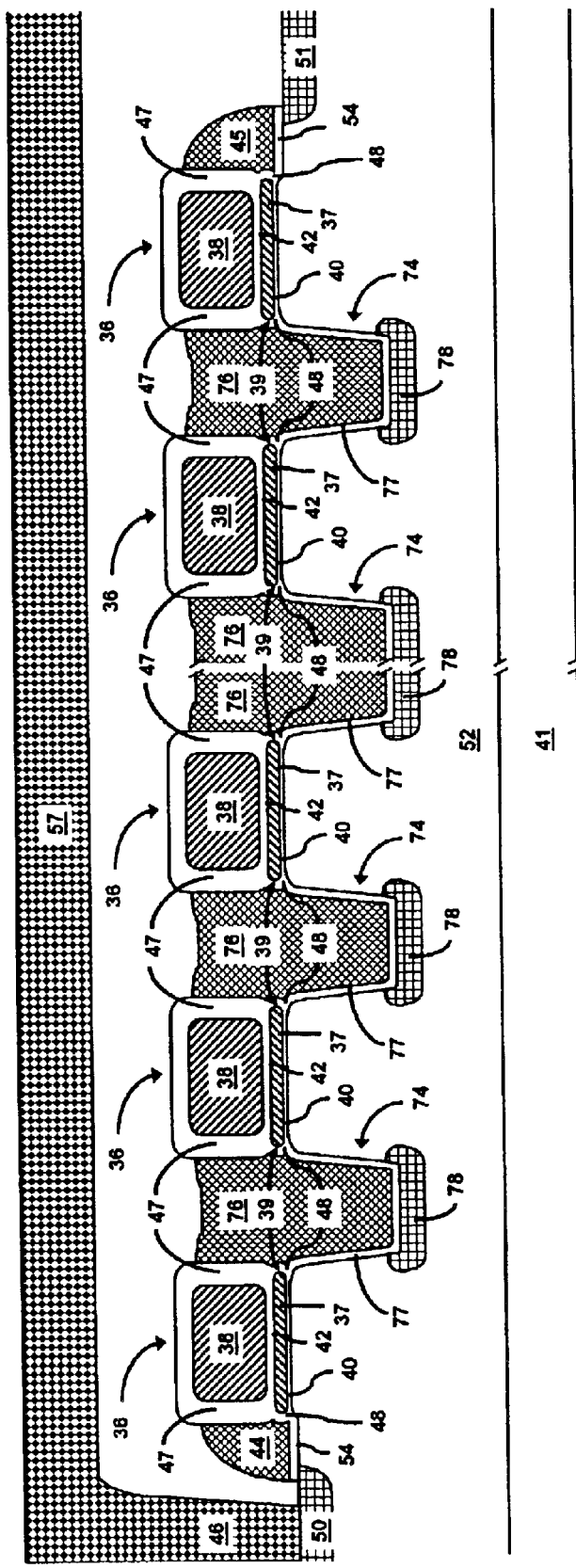
FIG. 9 is a cross-sectional view, taken along line 9—9 in FIG. 10, of another embodiment of a self-aligned split-gate NAND flash memory cell array incorporating the invention.
Figure 10:
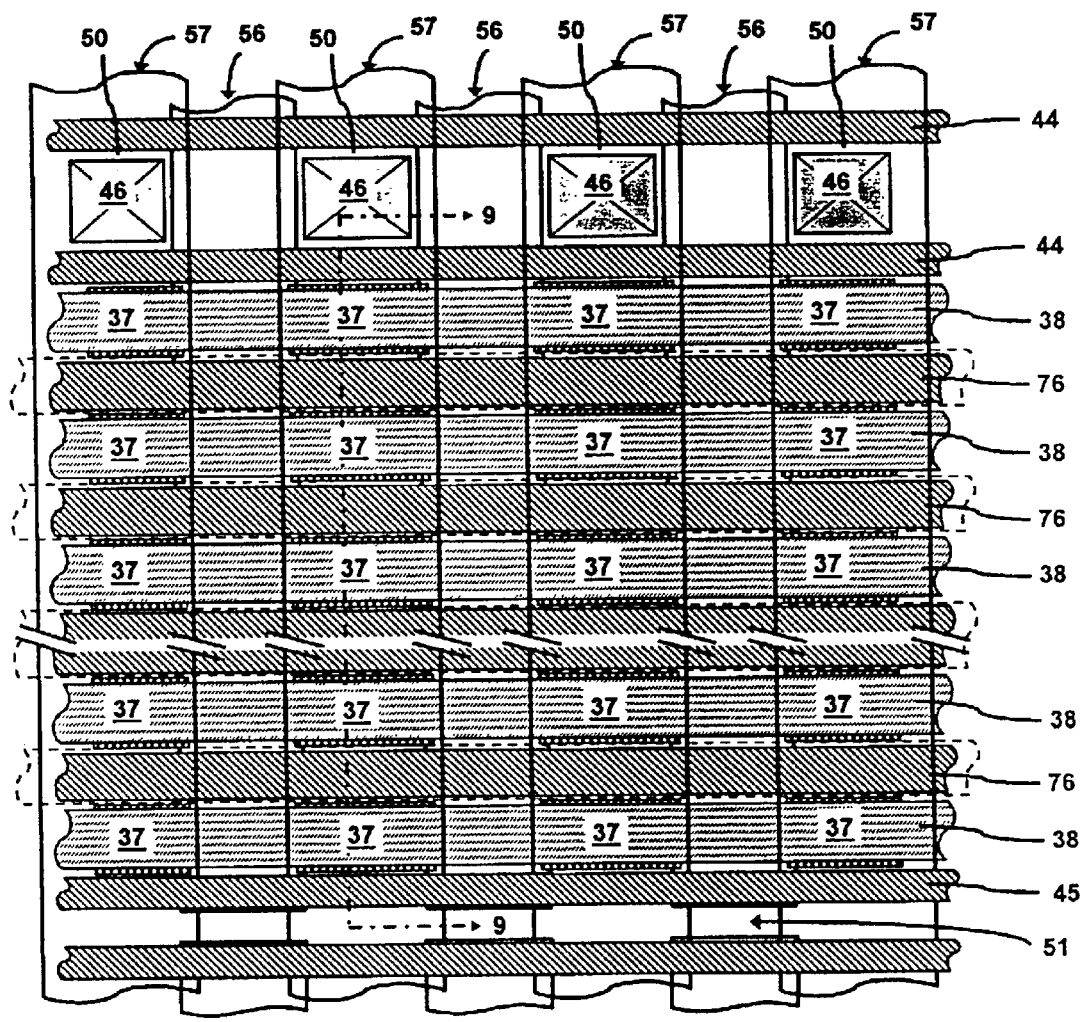
FIG. 10 is a top plan view of the embodiment of FIG. 9.

Another embodiment of a NAND cell array incorporating the invention is illustrated in FIGS. 9 and 10. To the extent that this embodiment is similar to that of FIGS. 6–7, like reference numerals designate corresponding elements in the two embodiments.

In this embodiment, a plurality of shallow trenches 74 are formed in the active region between bit line diffusion 50 and common source diffusion 51. Select gates 76 extend into the trenches, and are separated from the silicon substrate by a thick gate dielectric film 77, which can be either a pure thermal oxide or a combination of thermal oxide and CVD oxide. As in the previous embodiment, the select gates are formed of a conductive material such as doped polysilicon or polycide, and they are self-aligned with the control gates and floating gates in the adjacent cells. Each of the select gates 76 has two channel regions along the side walls of the trench and a heavily doped diffusion region near the bottom of the trench. Source diffusions 78 are formed in the substrate beneath the select gates and doped with the dopants of opposite type to the silicon substrate. The erase path in this embodiment is from the rounded side edges 39 of the floating gates through the tunnel oxide to the select gates.

As best seen in FIG. 10, select gates 44, 45 and 76 are parallel to control gates 38, which cross over the alternating floating gates 37 and isolation regions 56 in adjacent rows of cells. Bit lines 57 are perpendicular to the select and control gates, and cross over the bit line contact 46, select gates 44, 45 and 76, control gates 38, and common source regions 51 in each row of the array.

The memory cell array of FIGS. 9 and 10 can be fabricated by the process illustrated in FIGS. 11A–11L. In this process, an oxide layer 58 is thermally grown on the silicon substrate to a thickness of about 70 Å–150 Å, and a conductive layer 59 of polysilicon or amorphous silicon (poly-1) is deposited on the thermal oxide to a thickness on the order of 100 Å–1000 Å, and a dielectric layer 61 is formed on the silicon. The poly-1 is preferably doped with phosphorus, arsenic or boron to a level on the order of $10^{17}$ to $10^{20}$ per cm$^3$.

A dielectric film 61 (the inter-poly dielectric) is formed on the poly-1 layer. This film can be either a pure oxide or a combination of oxide and nitride, e.g. a layer of nitride between two layers of oxide (ONO) as in the embodiment of FIGS. 4A–4H.

A second layer of polysilicon 62 (poly-2) is deposited on dielectric film 61, and is subsequently etched to form the control gates 38. This layer has a thickness on the order of 1500 Å–3500 Å, and is doped with phosphorus, arsenic or boron to a level on the order of $10^{20}$ to $10^{21}$ per cm$^3$.

A CVD oxide or nitride layer 63 having a thickness on the order of 300 Å–1000 Å is deposited on the poly-2 layer, and is used as a mask to prevent the poly-2 material from etching away during subsequent dry etching steps.

Figure 11A:
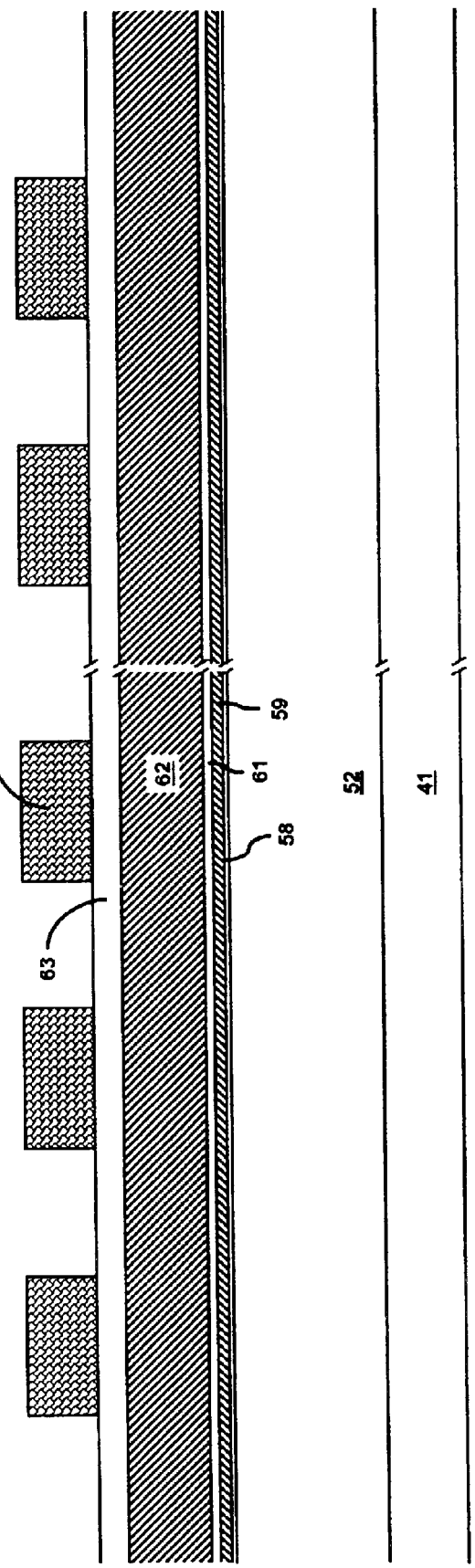
Figure 11B:
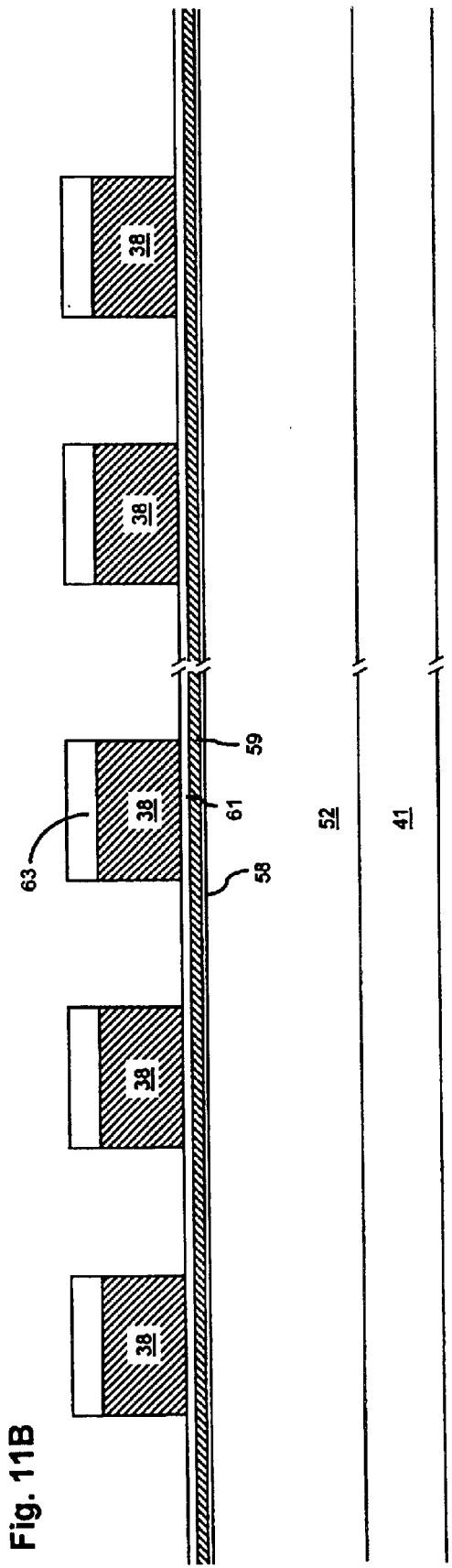

A photolithographic mask 64 is formed over layer 63 to define the control gates, and the unmasked portions of that layer and the poly-2 layer etched away anisotropically, leaving only the portions of the poly-2 which form the control gates 38, as illustrated in FIG. 11B.

Figure 11C:
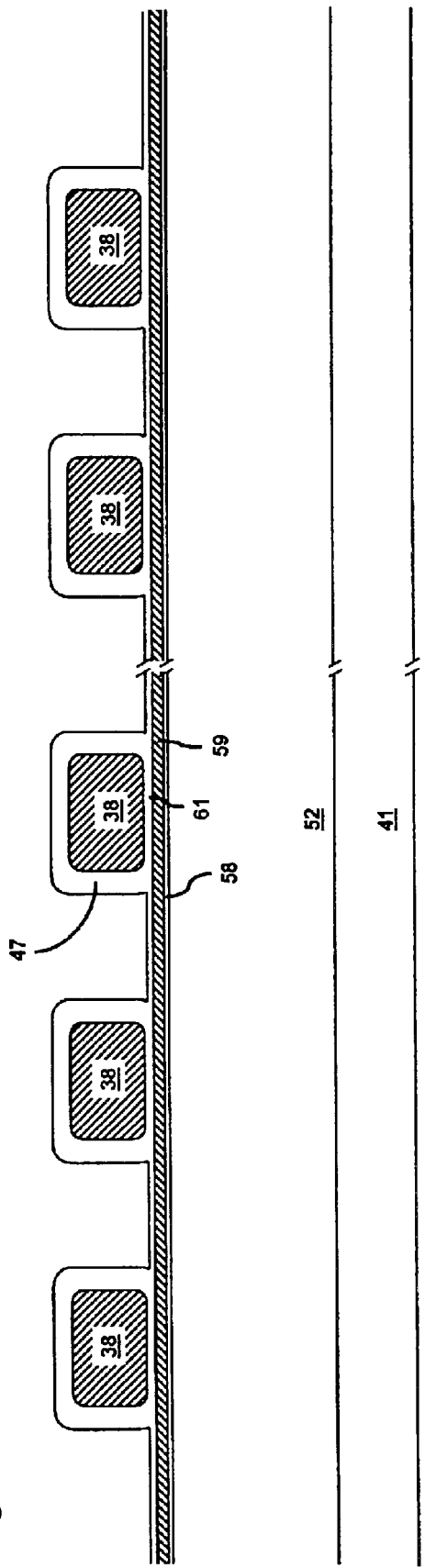

The photoresist is then stripped away, and oxide 47 is thermally grown on the side walls of the control gates to a thickness on the order of 200 Å–700 Å, as shown in FIG. 11C.

Figure 11D:
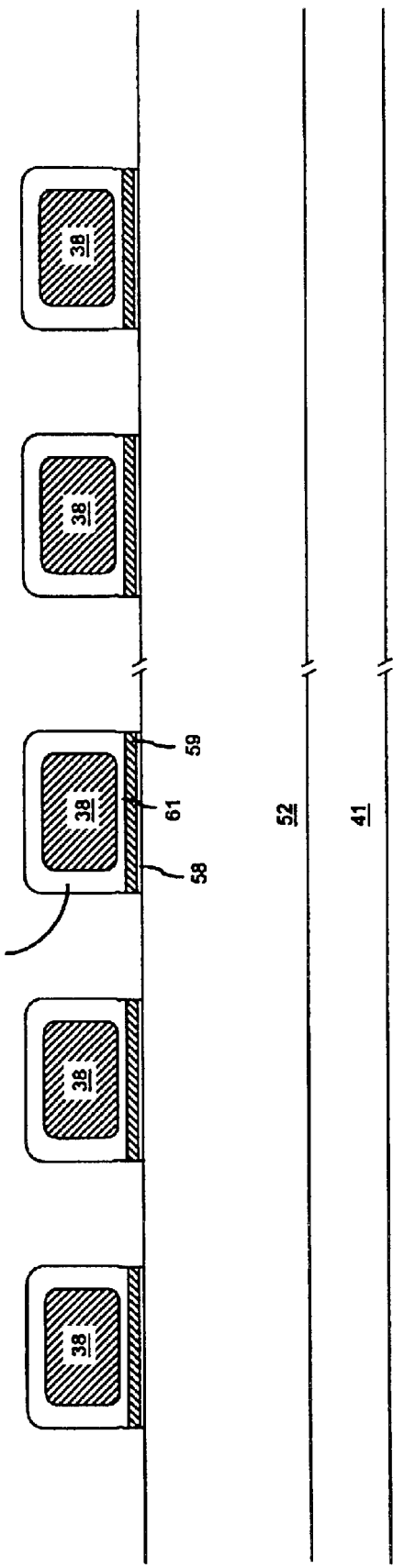

Using the oxide 47 as a mask, the exposed portions of the inter-poly dielectric 61 and the underlying portions of the poly-1 layer 59 and oxide layer 58 are etched away anisotropically, as illustrated in FIG. 11D. Further anisotropic dry etching results in the formation of trenches 74 in the upper portion of the silicon substrate, as illustrated in FIG. 11E.

Figure 11F:
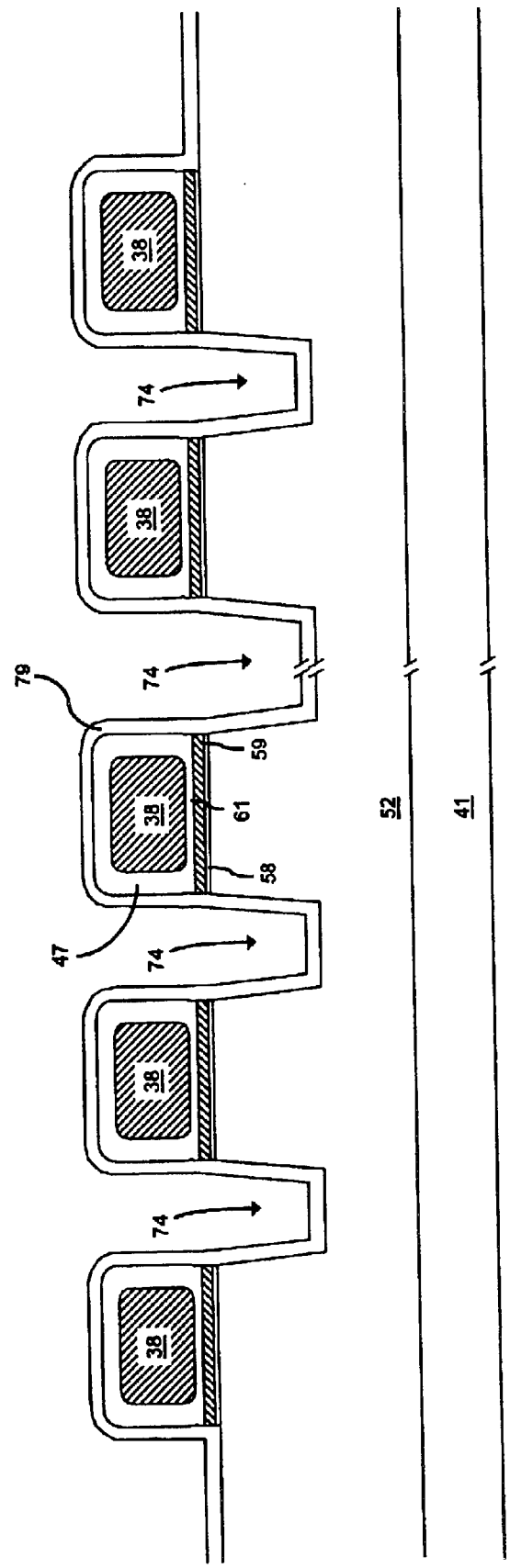
Figure 11G:
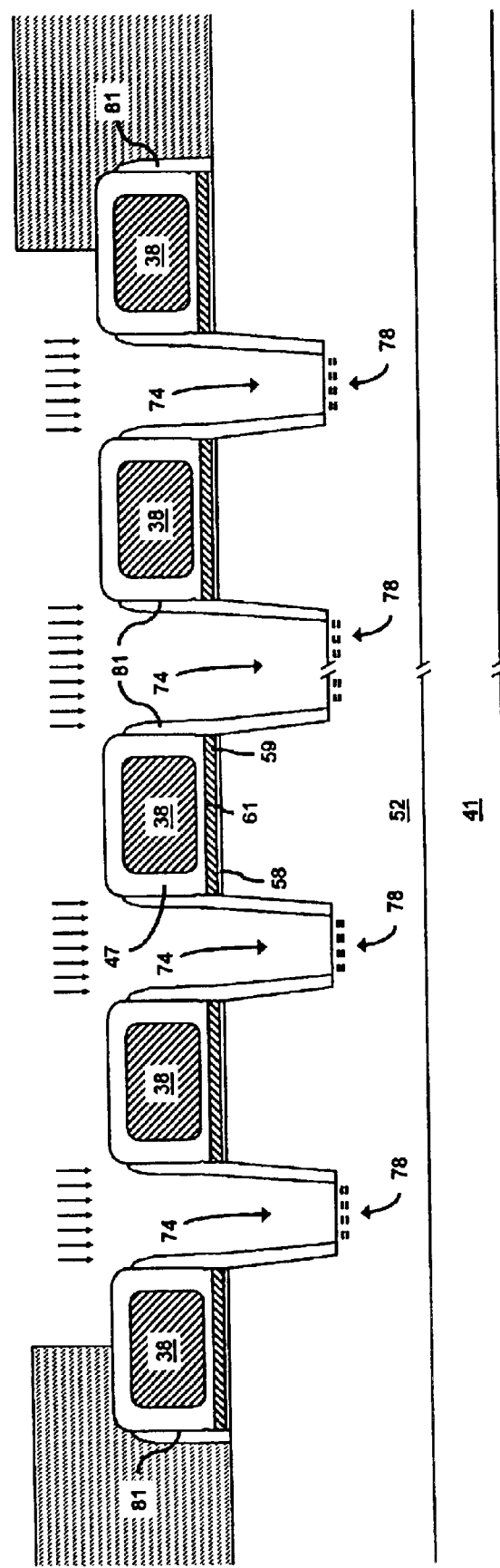

Next, a CVD oxide 79 is deposited across the wafer, as shown in FIG. 11F, then etched anisotropically to leave oxide spacers 81 along the side walls of the control gates and trenches as shown in FIG. 11G. Ions are then implanted through the bottom walls of the trenches to form source regions 78, as illustrated in FIG. 11G.

Figure 11H:
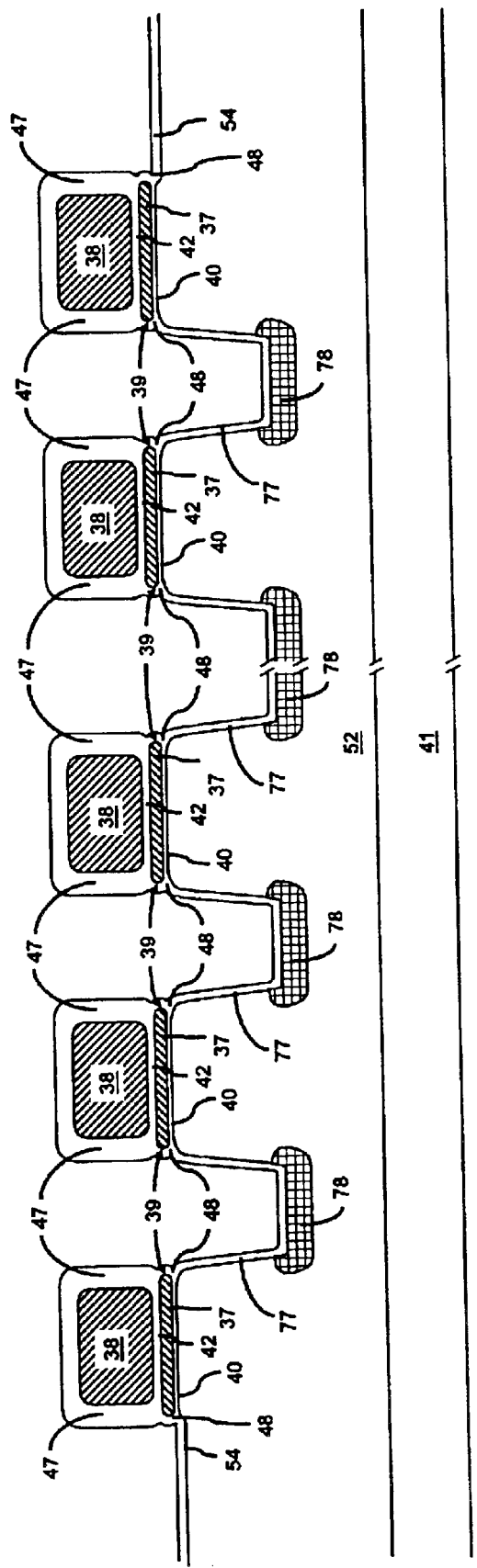
Figure 11L:
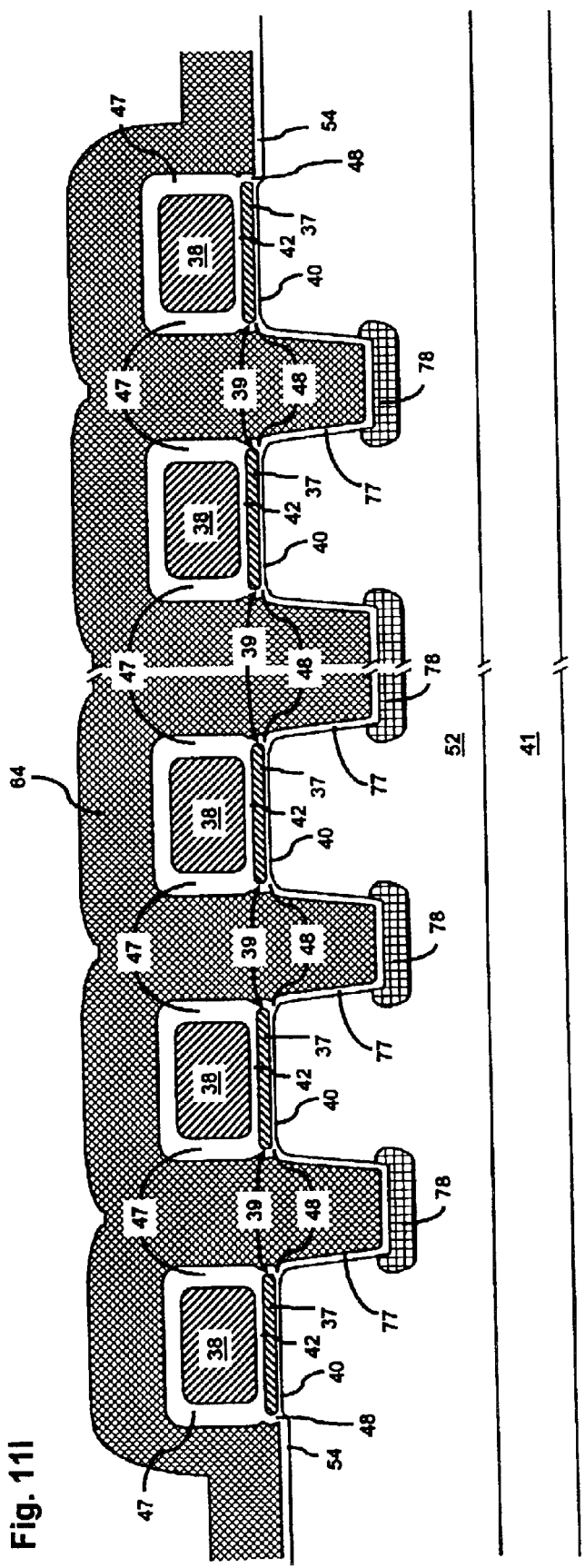

Thereafter, another thermal oxidation is performed, which builds up the gate oxide 54 for select gates 44, 45, tunnel oxide 48, the thermal oxide 77 on the walls of the trenches, and the oxide 47 surrounding the poly-2 control gates, as shown in FIG. 11H. Gate oxide 54 is thus built up to a thickness on the order of 100 Å–400 Å, and tunnel oxide 48 is built up to a thickness on the order of 100 Å–300 Å.

To improve the quality of the oxide films and reduce disturbances between the select gates and the floating gates, a thin CVD oxide of about 50 Å–200 Å can be deposited before or after thermal oxidation.

As in the process illustrated in FIGS. 4A–4H, during thermal oxidation, the side edges 39 of floating gates 37 become rounded because the oxidation rate of the polysilicon is faster near the interface between it and the dielectric materials above and below it. The rounded curvature results in an electric field enhancement which facilitates electron tunneling from the floating gates to the erase gates. Moreover, the rounding of the side edges eliminates the localized trapping effect that occurs in the tunnel oxide near the square corners of a floating gate when a cell operates in erase mode and the electrons tunnel from the floating gate to the select gate. Thus, the rounded edges enhance the program-and-erase performance of the memory cells.

As a result of these processing steps, each of the control gates is self-aligned to the floating gate beneath it, the control gate is narrower than the floating gate, and the edges of the floating gate extend laterally beyond the edges of the control gate.

Following thermal oxidation, a conductive layer (poly-3) 65 is deposited into the trenches and over the entire wafer, as illustrated in FIG. 11I. This layer is typically doped polysilicon or polycide, and it is deposited to a thickness on the order of 1500 Å–4000 Å above the dielectric film 47 overlying the control gates.

Figure 11J:
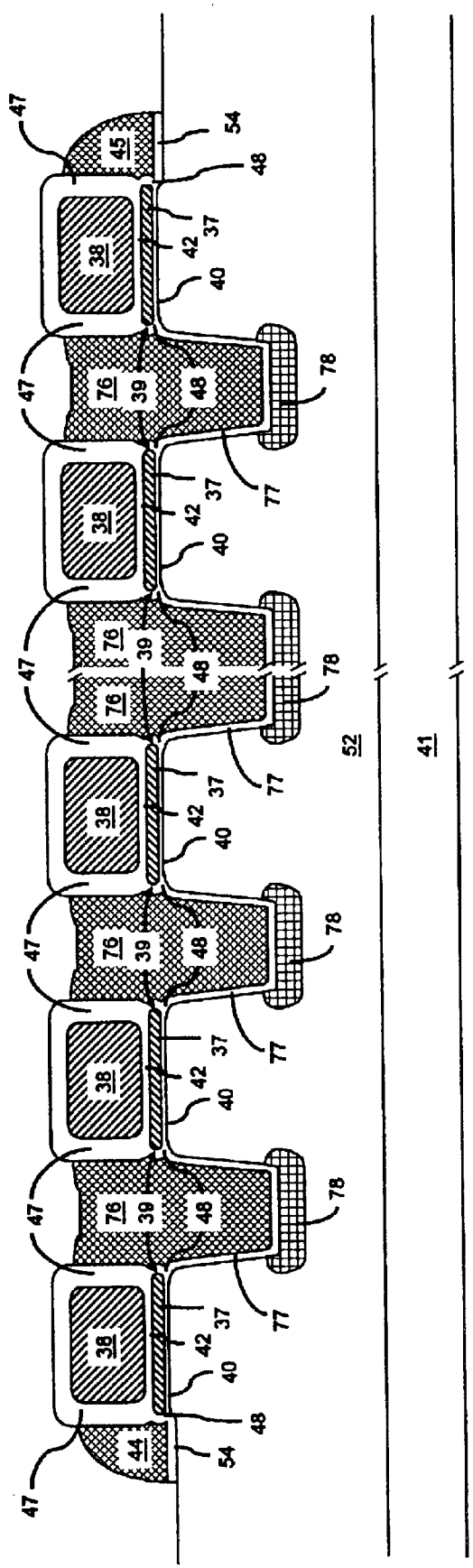

The poly-3 layer is then etched anisotropically, leaving only the portions of it which form select gates 44, 45 and 76, as illustrated in FIG. 11J. Being formed in this manner, the select gates are self-aligned and parallel to the control gates.

Figure 11K:
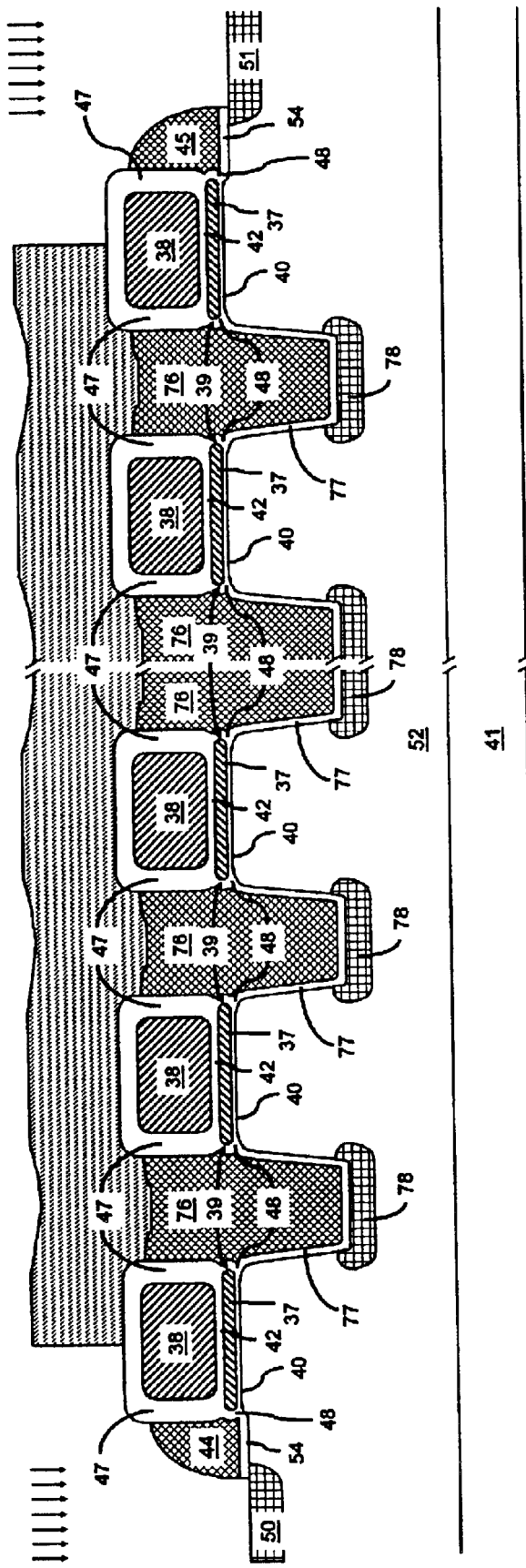
Figure 11L:
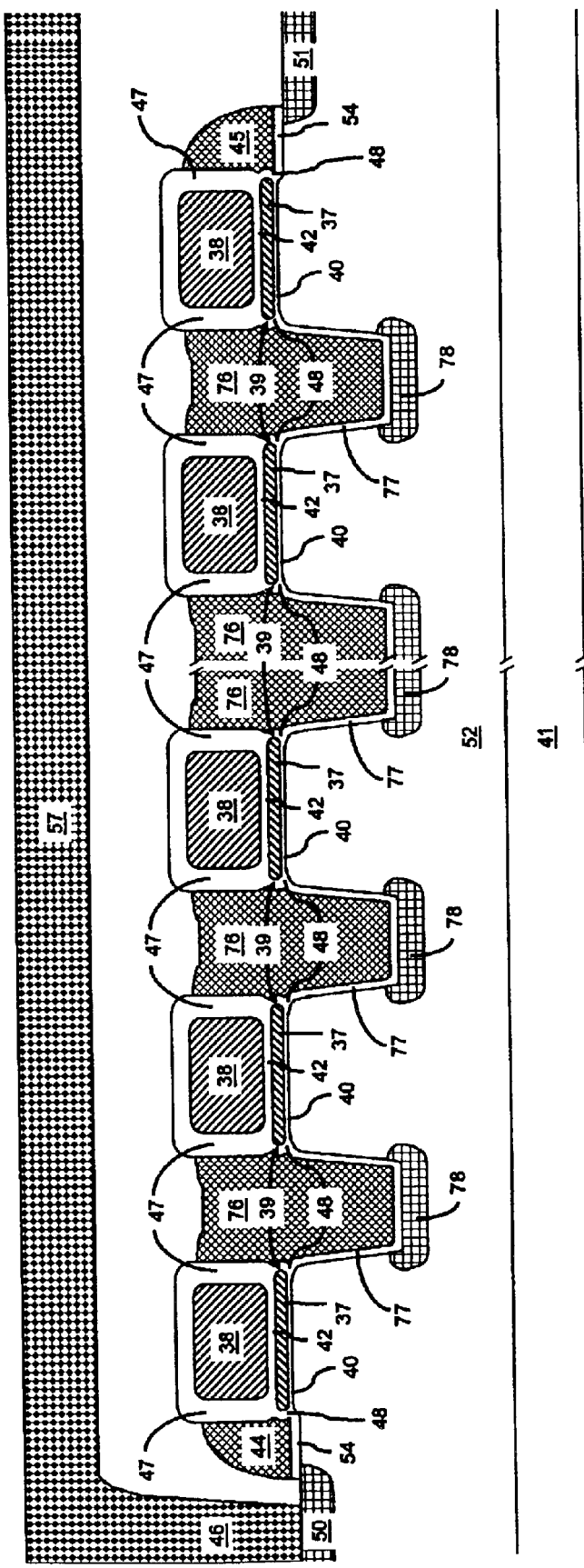

N-type dopants such as $P^{31}$ or $As^{75}$ are implanted into the substrate to form the bit line diffusion 50 and common source diffusion 51, as illustrated in FIG. 11K.

Thereafter, a glass material such as phosphosilicate glass (PSG) or borophosphosilicate glass (BPSG) is deposited across the entire wafer, then etched for bit line contacts 46. Finally, a metal layer is deposited over the glass and patterned to form bit lines 57 and bit line contacts 46.

Operation and use of the embodiment of FIG. 9 can be described with reference to FIGS. 12A–12C where exemplary bias voltages for erase (ERS), program (PGM) and read (RD) operations are shown next to the terminals of the memory cell array. In this example, memory cell $C_{1n}$ is selected. This cell is located at the intersection of control gate $CG_1$ and bit line BLn, and is encircled on the drawing for ease of location. All of the other memory cells in the array are unselected.

Erasing can be done with either of two different bias conditions. In the first erase mode, the control gate of the memory cell is biased at −7 to −12 volts, select gates $SG_1$–$SG_{15}$ are biased at 3–7 volts, select gates $SG_0$ and $SG_{16}$ are biased either at 0 volts or at 3–7 volts, the bit line is floating, and the common source is biased at 0 volts. In the second erase mode, the control gate, P-well and common source of the memory cell are biased at 0 volts, select gates $SG_1$–$SG_{15}$ are biased at 9–12 volts, select gates $SG_0$ and $SG_{16}$ are biased either at 0 volts or at 9–12 volts, and the bit line is floating.

With these bias conditions, most of the voltage difference between the control gate and the select gate appears across the tunnel oxide surrounding the rounded sidewall of floating gate. That triggers Fowler-Nordheim tunneling, with electrons tunneling from the floating gate to the select gate. As the floating gate becomes more positively charged, the threshold voltage of the memory cell, which is preferably on the order of −3 to −6 volts, becomes lower. This results in an inversion layer in the channel under the floating gate when the control gate is biased at 0 volts. Therefore, the memory cell goes into the conductive state (logic "1") after the erase operation. In the unselected memory cells, the control gates and the erase gates are biased at 0 volts, with the result that there is no Fowler-Nordheim tunneling during the erase operation.

Figure 12A:
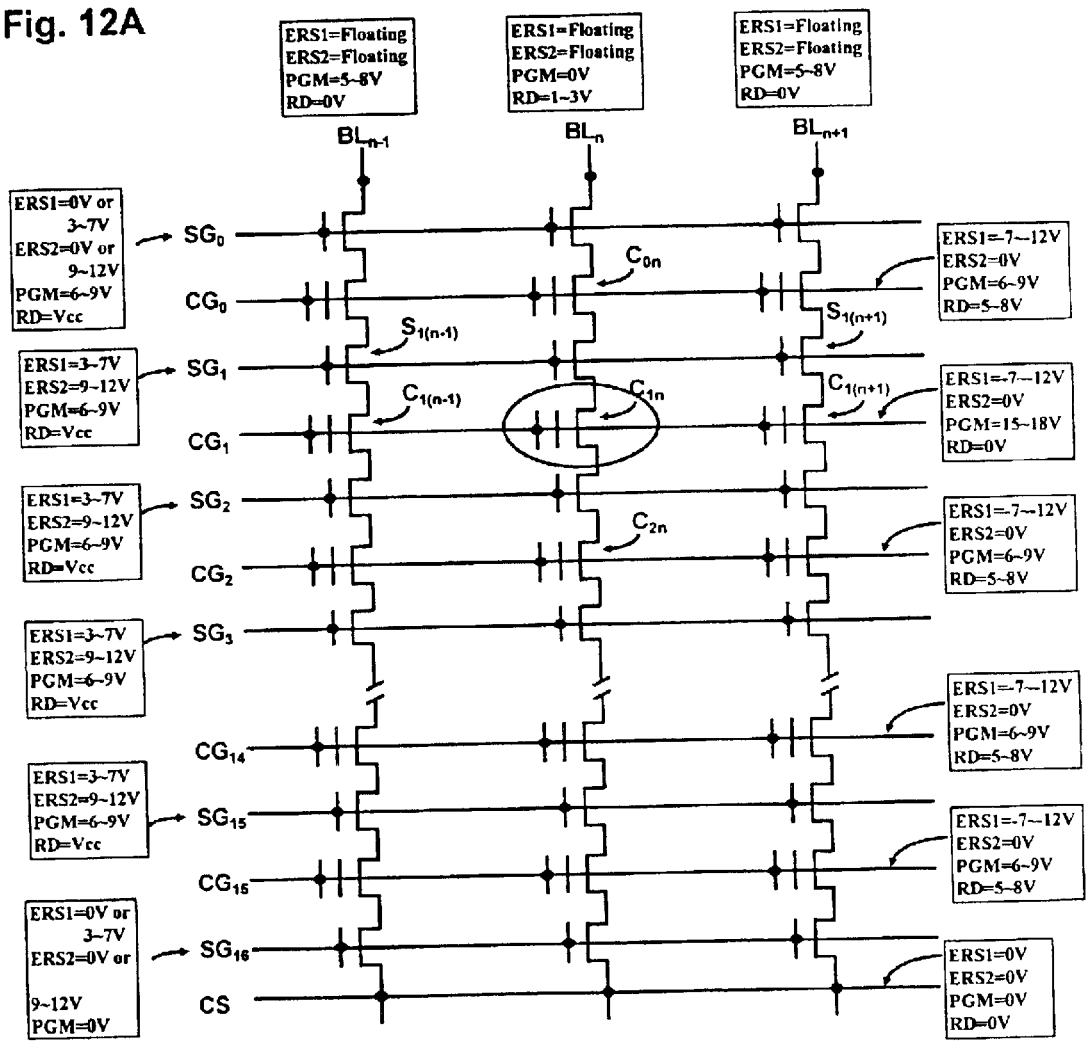
FIG. 12 is a circuit diagram of a small memory array as in the embodiment of FIG. 9, showing exemplary bias conditions for erase, program and read operations.

In the program mode shown in FIG. 12A, the control gate of the selected memory cell $C_{1n}$ is biased to a level of 15–18 volts, 6–9 volts is applied to select gates $SG_0$–$SG_{15}$, and the bit line, select gate $SG_{16}$, and the common source are maintained at 0 volts. With these bias conditions, most of the applied voltage appears across the gate oxide beneath the floating gate, which results in Fowler-Nordheim tunneling, with electrons migrating from the channel region to the floating gate. At the end of the program operation, the floating gate is negatively charged, and the threshold voltage of the memory cell, which preferably is on the order of 1–3 volts, becomes higher. Therefore, the memory cell is turned off when the control gate is biased at 0 volts during a read operation. Following a program operation, the memory cell goes into a non-conductive state (logic "0").

In the unselected memory cells $C_{1(n-1)}$ and $C_{1(n+1)}$ that share the same control gate with the selected cell $C_{1n}$, the bit line is biased at 5–8 volts, and the control gate is biased at 15–18 volts. This results in negligible Fowler Nordheim tunneling, and the floating gate charges remain unchanged. The other unselected memory cells $C_{0n}$ and $C_{2n}$ are biased with 0 volts on the bit line and 6–8 volts on the control gate. This also minimizes Fowler-Nordheim tunneling, and the charges on the floating gates do not change.

Figure 12B:
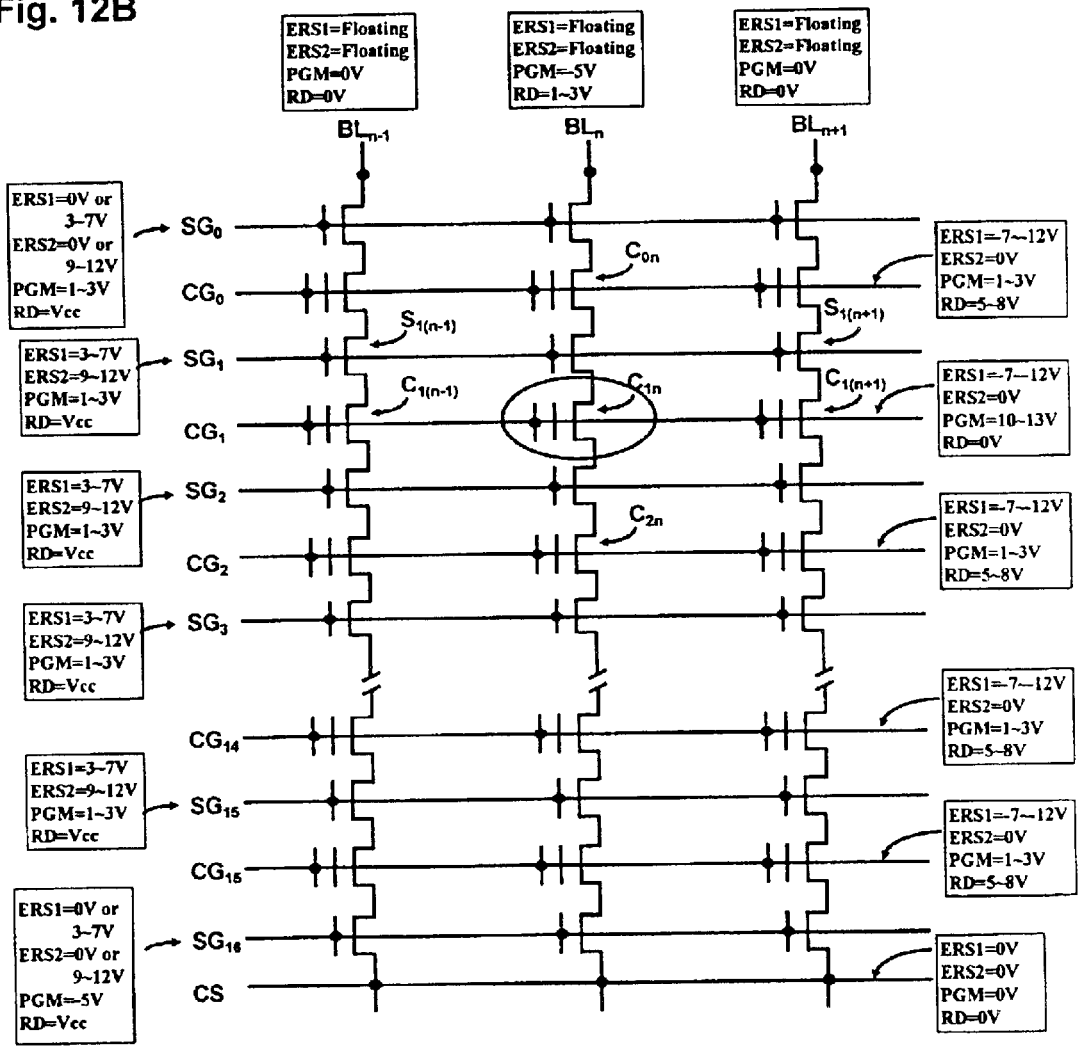

Another set of bias conditions for the program mode is illustrated in FIG. 12B. In this example, the selected memory cell $C_{1n}$ is biased with 10–13 volts on the control gate, 1–3 volts on select gates $SG_0$–$SG_{15}$, −5 volts on select gate $SG_{16}$, the bit line and P-well, and 0 volts on the common source. With the cell biased in this manner, most of the applied voltage falls across the gate oxide beneath the floating gate. That results in Fowler-Nordheim tunneling which causes electrons to migrate from the channel region to the floating gate.

Figure 12C:
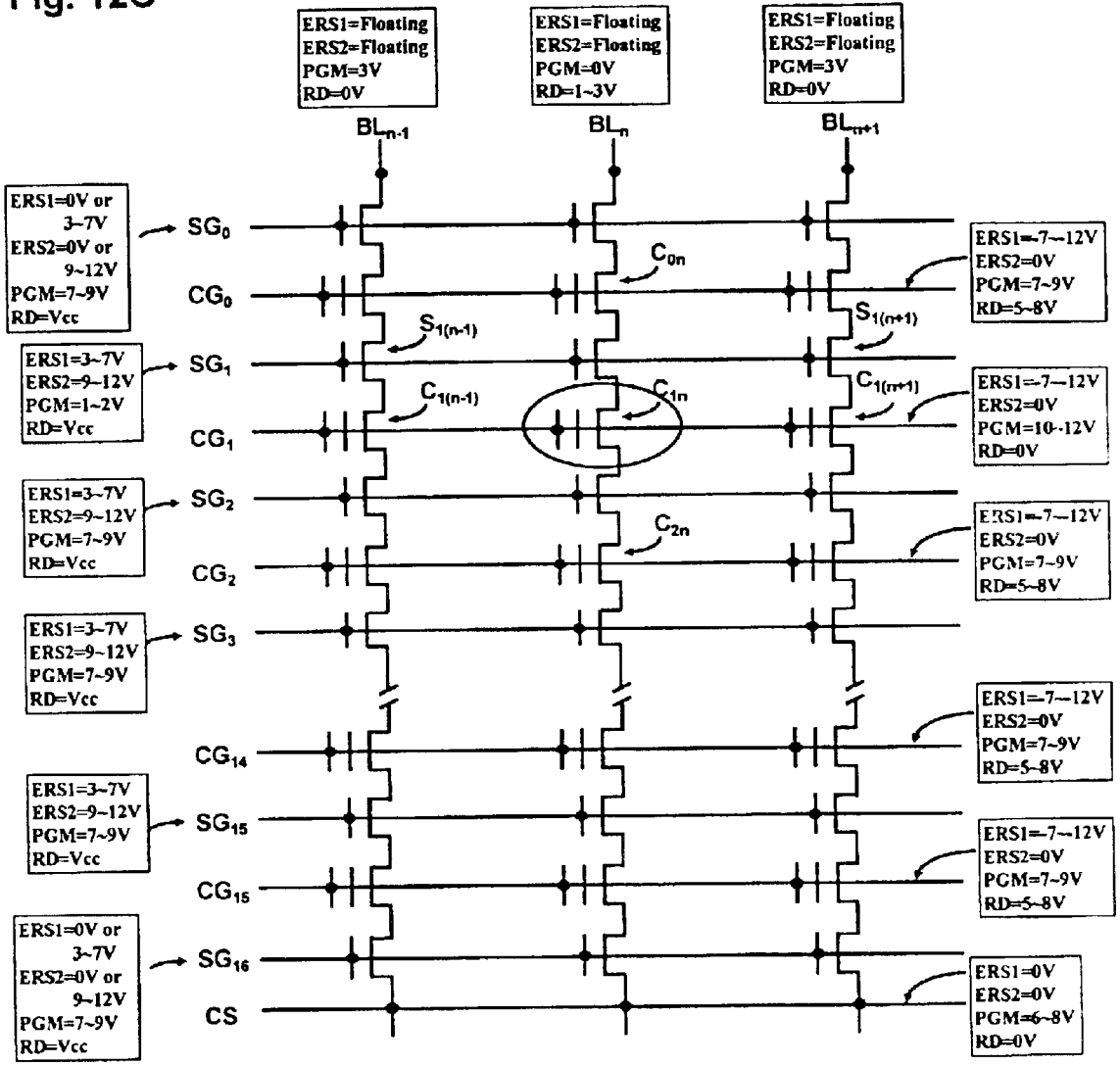

FIG. 12C illustrates a third set of bias conditions for the program mode, in which 10–12 volts is applied to the control gate of the selected memory cell $C_{1n}$, 7–9 volts is applied to select gates $SG_0$ and, $SG_2$–$SG_{16}$ and to the control gates of other memory cells in the same bit line direction as the selected cell (e.g. $C_{0n}$ and $C_{2n}$), the bit line is maintained at 0 volts, and 6–8 volts is applied to the common source. The cells and the select transistors are turned on by applying 7–9 volts to the control gates and select gates. The voltage applied to the select gate ($SG_1$ in this example) just before the selected cell ($C_{1n}$ in this example) can be on the low side, preferably on the order of 1–2 volts.

With these bias conditions, most of the voltage between the common source and the bit line appears across the mid-channel region between select gate $SG_1$ and the floating gate of the selected cell $C_{1n}$, resulting in a high electric filed in that region. In addition, since the floating gate is coupled to a high voltage from the common source node and the control gate $CG_1$, a strong vertical electric field is established across the oxide between the mid-channel region and the floating gate. When electrons flow from the bit line to the common source during the program operation, they are accelerated by the electric field across the mid-channel region, and some of them become heated. Some of the hot electrons get accelerated by the vertical field, which causes them to overcome the energy barrier of the oxide (about 3.1 eV) and inject into the floating gate.

At the end of the program operation, the floating gate is negatively charged, the threshold voltage of the memory cell, which preferably is on the order of 1–3 volts, becomes higher. Thus, the memory cell is turned off when the control gate is biased at 0 volts during a read operation. Following a program operation, the memory cell goes into a non-conductive state (logic "0").

In the unselected memory cells $C_{1(n-1)}$ and $C_{1(n+1)}$ which share the same control gate with the selected cell $C_{1n}$, the bit line is biased at 3 volts, the select gate $SG_1$ is at 1–2 volts, and the control gate is at 10–12 volts. Thus, select transistors $S_{1(n-1)}$ and $S_{1(n+1)}$ are turned off, and there is no mid-channel hot carrier injection takes in cells $C_{1(n-1)}$ and $C_{1(n+1)}$. The other unselected memory cells $C_{0n}$ and $C_{2n}$ are biased with 0 volts to the bit line and 7–9 volts to the control gate, which minimizes the mid-channel hot carrier injection, and the floating gate charges are unchanged.

In the read mode, the control gate of the selected memory cell $C_{1n}$ and the source are biased to 0 volts, 1–3 volts is applied to the bit line, and Vcc is applied to the select gates. The unselected memory cells in the bit line direction, e.g. $C_{0n}$ and $C_{2n}$, are turned on by applying 5–8 volts to their control gates. When the memory cell is erased, the read shows a conductive state because the channel of selected cell is turned on, and the other cells and the select transistors in the same bit line direction also turned on. Thus, a logic "1"

is returned by the sense amplifier. When the memory cell is programmed, the read shows a non-conductive state because the channel of the selected cell is turned off, and hence the sense amplifier returns a logic "0". In the unselected memory cells $C_{1(n-1)}$ and $C_{1(n+1)}$, both the bit line and common source nodes are biased at 0 volts, and there is no current flow between the bit line and the common source nodes.

The invention has a number of important features and advantages. It provides a self-aligned split-gate NAND flash memory cell array which has significantly smaller cell size and greater cell density than memory structures heretofore provided. The array comprises a plurality of self-aligned split cells between a bit line diffusion and a common source diffusion. Each cell has control and floating gates which are stacked and self-aligned with each other, and a third gate which is split from but self-aligned with the other two.

In the embodiment of FIG. 2, for example, the split gates are used as erase gates, with heavily doped diffusion regions under them. The erase path is from the rounded side edge of the floating gate to the corresponding erase gate, and the program path is from the channel region to the floating gate above it, with Fowler-Nordheim tunneling along both paths. The array is biased so that all of the memory cells in it can be erased simultaneously, while programming is bit selectable. As noted above, the size of the memory cells is greatly reduced with this structure.

In the embodiment of FIG. 6, the split gates are used as select gates, and each of them has a channel region beneath it. The erase path is from the rounded side edge of the floating gate to the corresponding select gate, with Fowler-Nordheim tunneling, and the program path is from the off-gate channel region between the floating gates to the floating gates, using hot carrier injection. This array is also biased so that all of the memory cells in it can be erased simultaneously, while programming is bit selectable. Here again, the size of the memory cells is greatly reduced with this structure.

In the embodiment of FIG. 9, shallow trenches are formed in the active region between the bit line and common source. The split gates are used as select gates which extend into the trenches between adjacent control gates. These select gates have two channel regions along the side walls of the trenches and a heavily doped diffusion region near the bottom of the trench. The erase path is from the rounded side edge of the floating gate to the corresponding select gate, with Fowler-Nordheim tunneling. The program path is either from the channel region to the floating gate above it, with Fowler-Nordheim tunneling, or from the off-gate channel region to the floating gate near it, using hot carrier injection. This array is also biased so that all of the memory cells in the array can be erased simultaneously, while programming is bit selectable. The size of the memory cells is also greatly reduced with this structure.

It is apparent from the foregoing that a new and improved self-aligned split-gate NAND flash memory and process of fabrication have been provided. While only certain presently preferred embodiments have been described in detail, as will be apparent to those familiar with the art, certain changes and modifications can be made without departing from the scope of the invention as defined by the following claims.

What is claimed is:

1. A NAND flash memory cell array, comprising: a substrate having an active area, a plurality of vertically stacked pairs of floating gates and control gates arranged in rows above the active area, with the floating gates being relatively thin and having curved side edges and the control gates being positioned above the floating gates, split gates interposed between and allgned with the stacked gates in each row, a select gate adjacent to the stacked gates at one end of each row, a bit line above each row, a bit line diffusion in the active area at the end of each row near the select gate, a bit line contact interconnecting the bit line and the bit line diffusion in each row, relatively thin tunnel oxides between the curved side edges of the floating gates and adjacent ones of the split and select gates, and source regions in the active area beneath the split gates partially underlying the floating gates.

2. The NAND flash memory cell array of claim 1 including a second select gate at the end of the row opposite the first named select gate.

3. The NAND flash memory cell array of claim 1 wherein the control gates are substantially thicker in vertical dimension and narrower in lateral dimension than the floating gates.

4. The memory cell array of claim 1 including a relatively thin dielectric film between each of the floating gates and the substrate, a relatively thick dielectric between the select gate at the end of each row and the substrate, and a relatively thick dielectric between each of the split gates adn the source region beneath it.

5. In a process of fabricating a NAND flash memory cell array, the steps of: forming an oxide layer on an active area in a silicon substrate, forming a first silicon layer on the oxide layer, forming a dielectric film on the first silicon layer, forming a second silicon layer on the dielectric film, etching away a portion of the second silicon layer to form a row of control gates with exposed side walls, forming an oxide on the side walls of the control gates, using the oxide on the side walls of the control gates as a mask, anisotropically etching away portions of the first silicon layer to form floating gates which are thereby self-aligned with and of greater lateral extent than the control gates, forming source diffusions in the active area of the substrate between the gates, forming a thermal oxide on the side edges of the floating gates and on other oxide surfaces, depositing a third silicon layer over the thermal oxide, removing portions of the third silicon layer to form a select gate next to the control gate at one end of the row and split gates between and self-aligned with the control gates, forming a bit line diffusion in the active area of the substrate near the select gate, and forming a bit line above the row and a bit line contact which interconnects the bit line and the bit line diffusion.

6. In a process of fabricating a NAND flash memory cell array, the steps of: forming an oxide layer on an active area in a silicon substrate, forming a first silicon layer on the oxide layer, forming a dielectric film on the first silicon layer, forming a second silicon layer on the dielectric film, etching away a portion of the second silicon layer to form a row of control gates with exposed side walls, forming an oxide on the side walls of the control gates, using the oxide on the side walls of the control gates as a mask, anisotropically etching away portions of the first silicon layer to form floating gates which are thereby self-aligned with and of greater lateral extent than the control gates, forming source diffusions in the active area of the substrate between the gates, forming a thermal oxide on the side edges of the floating gates and on other oxide surfaces, depositing a third silicon layer over the thermal oxide, removing portions of the third silicon layer to form a select gates at opposite ends of the row adn split gates between adn self-aligned with the control gates, forming a bit line diffusion and a common source diffusion in the active area of the substrate near respective ones of the select gates, and forming a bit line above the row and a bit line contact which interconnects the bit line adn the bit line diffusion.

7. A NAND flash memory cell array, comprising: a substrate having an active area, a plurality of vertically stacked pairs of floating gates and control gates arranged in rows above the active area, with the floating gates being relatively thin and having curved side edges and the control gates being positioned above the floating gates, erase gates interposed between and allgned with the stacked gates in each row, select gates adjacent to the stacked gates at opposite ends of each row, a bit line above each row, a bit line diffusion and a common source diffusion in the active area at opposite ends of each row near the select gates, a bit contact interconnecting the bit line and the bit line diffusion in each row, relatively thin tunnel oxides between the curved side edges of the floating gates and adjacent ones of the erase and select gates, and source regions in the active area beneath the erase gates partially underlying the floating gates.

8. The NAND flash memory cell array of claim 7 including an erase path extending from the curved side edge of each floating gate, through the tunnel oxide to the adjacent erase gate.

9. The NAND flash memory cell array of claim 7 including a program path comprising a gate oxide between each of the floating gates and an underlying channel region in the substrate through which electrons can travel to build up a negative charge on the floating gate.

10. In a process of fabricating a NAND flash memory cell array, the steps of: forming an oxide layer on an active area in a silicon substrate, forming a first silicon layer on the oxide layer, forming a dielectric film on the first silicon layer, forming a second silicon layer on the dielectric film, etching away a portion of the second silicon layer to form a row of control gates with exposed side edges, forming an oxide on the side walls of the control gates, using the oxide on the side walls of the control gates as a mask, anisotropically etching away portions of the first silicon layer to form floating gates which are thereby self-aligned with and of greater lateral extent than the control gates, forming source diffusions in the active area of the substrate between the gates, forming a thermal oxide on the side edges of the floating gates and on other oxide surfaces, depositing a third silicon layer over the thermal oxide, removing portions of the third silicon layer to form a select gates next to the control gates at opposite ends of the row and erase gates between and self-aligned with the control gates, forming a bit line diffusion and a common source diffusion in the active area at opposite ends of each row near the select gates, and forming a bit line above the row and a bit line contact which interconnects the bit line and the bit line diffusion.

11. The process of claim 10 including the step of forming an erase path which extends from the curved side edge of each floating gate, through the tunnel oxide to the adjacent erase gate by applying a relatively negative voltage to the control gate stacked above the floating gate and a relatively positive voltage to the adjacent erase gate, with high voltage coupling between the control gate, floating gate and substrate, and electrons migrating from the floating gate to the erase gate.

12. The process of claim 10 including the step of forming a program path between each of the floating gates and an underlying channel region in the substrate by applying a relatively negative voltage to the bit line diffusion and substrate and a relatively positive voltage to the control gate above the floating gate so that electrons tunnel from the channel region to the floating gate and a negative charge builds up on the floating gate.

13. A NAND flash memory cell array, comprising: a substrate having an active area, a bit line diffusion and a common source diffusion positioned toward opposite sides of the active area, a plurality of memory cells arranged in rows between the bit line diffusion and the source diffusion, each of the memory cells having a floating gate, a control gate stacked above the floating gate and a cell select gate next to the stacked gates, a row select gate partially overlapping the diffusion at the one end of each row, a bit line above each row, and a bit line contact interconnecting the bit line and the bit line diffusion in each row.

14. A NAND flash memory cell array, comprising: a substrate having an active area, a plurality of vertically stacked pairs of floating gates and control gates arranged in rows above the active area, with the floating gates being relatively thin and having curved side edges and the control gates being positioned above the floating gates, a row select gate adjacent to the stacked gate at one end of each row, cell select gates interposed between and aligned with the stacked gates in each row, relatively thin tunnel oxides between the curved side edges of the floating gates and adjacent ones of the select gates, an erase path extending from the curved side edge of each floating gate, through the tunnel oxide to the adjacent select gate, a bit line above each row, a bit line diffusion and a common source diffusion in the active area at opposite ends of each row, with the row select gate partially overlapping the diffusion at the one end of the row, and a bit line contact interconnecting the bit line and the bit line diffusion in each row.

15. A NAND flash memory cell array, comprising: a substrate having an active area, a plurality of vertically stacked pairs of floating gates and control gates arranged in rows above the active area, with the floating gates being relatively thin and having curved side edges and the control gates being positioned above the floating gates, a row select gate adjacent to the stacked gate at one end of each row, cell select gates interposed between and aligned with the stacked gates in each row, relatively thin tunnel oxides between the curved side edges of the floating gates and adjacent ones of the select gates, a program path comprising a gate oxide between one the floating gates and an underlying channel region in the substrate through which electrons can travel by hot carrier injection to build up a negative charge on the floating gate, a bit line above each row, a bit line diffusion and a common source diffusion in the active area at opposite ends of each row, with the row select gate partially overlapping the diffusion at the one end of the row, and a bit line contact interconnecting the bit line and the bit line diffusion in each row.

16. In a process of fabricating a NAND flash memory cell array, the steps of: forming an oxide layer on an active area in a silicon substrate, forming a first silicon layer on the oxide layer, forming a dielectric film on the first silicon layer, forming a second silicon layer on the dielectric film, etching away a portion of the second silicon layer to form a row of control gates with exposed side walls, forming an oxide on the side walls of the control gates, using the oxide on the side walls of the control gates as a mask, anisotropically etching away portions of the first silicon layer to form floating gates which are thereby self-aligned with and of greater lateral extent than the control gates, forming a thermal oxide on the side edges of the floating gates and on other oxide surfaces, depositing a third silicon layer over the thermal oxide, removing portions of the third silicon layer to form row select gates next to the control gates at opposite ends of the row and cell select gates between and self-aligned with the control gates, forming a bit line diffusion and a common source diffusion in the active area at opposite ends of each row near the row select gates, and forming a bit line above the row and a bit line contact which interconnects the bit line and the bit line diffusion.

17. The process of claim 16 including the step of forming an erase path which extends from the curved side edge of each floating gate, through the tunnel oxide to the adjacent select gate by applying a relatively negative voltage to the control gate stacked above the floating gate and a relatively positive voltage to the cell select gate, with high voltage coupling between the control gate, floating gate and substrate, and electrons migrating from the floating gate to the cell select gate.

18. The process of claim 16 including the step of forming a program path between one of the floating gates and an underlying channel region in the substrate by applying a relatively negative voltage to the bit line diffusion and a substrate and a relatively positive voltage to the control gate above the floating gate so that electrons travel by hot carrier injection from the channel region to the floating gate and build up a negative charge on the floating gate.

19. A NAND flash memory cell array, comprising: a substrate having an active area, a plurality of vertically stacked pairs of floating gates and control gates arranged in rows above the active area, with the floating gates being relatively thin and having curved side edges and the control gates being positioned above the floating gates, row select gates adjacent to the stacked gates at opposite ends of each row, shallow trenches formed in the active area of the substrate between the stacked gates, cell select gates extending into the trenches and aligned with the stacked gates in each row, a bit line above each row, a bit line diffusion and a common source diffusion in the active area at opposite ends of each row near the row select gates, a bit line contact interconnecting the bit line and the bit line diffusion in each row, relatively thin tunnel oxides between the curved side edges of the floating gates and adjacent ones of the select gates, and source regions in the active area beneath the cell select gates.

20. The NAND flash memory cell array of claim 19 including an erase path extending from the curved side edge of each floating gate, through the tunnel oxide to the adjacent select gate.

21. The NAND flash memory cell array of claim 19 including a program path comprising a gate oxide between one the floating gates and an underlying channel region in the substrate through which electrons can travel by hot carrier injection to build up a negative charge on the floating gate.

22. The NAND flash memory cell array of claim 19 including a program path comprising a gate oxide between one the floating gates and an underlying channel region in the substrate through which electrons can travel by Fowler-Nordheim tunneling to build up a negative charge on the floating gate.

23. In a process of fabricating a NAND flash memory cell array, the steps of: forming an oxide layer on an active area in a silicon substrate, forming a first silicon layer on the oxide layer, forming a dielectric film on the first silicon layer, forming a second silicon layer on the dielectric film, etching away a portion of the second silicon layer to form a row of control gates with exposed side walls, forming an oxide on the side walls of the control gates, using the oxide on the side walls of the control gates as a mask, anisotropically etching away portions of the first silicon layer to form floating gates which are thereby self-aligned with and of greater lateral extent than the control gates, forming trenches in the substrates between the gates, forming a thermal oxide on the side edges of the floating gates and trenches and on other oxide surfaces, forming source diffusion regions in the substrate under the trenches, depositing a third silicon layer over the thermal oxide and into the trenches, removing portions of the third silicon layer to form row select gates next to the control gates at opposite ends of the row and cell select gates between and self-aligned with the control gates, forming a bit line diffusion and a common source diffusion in the active area at opposite ends of each row near the row select gates, and forming a bit line above the row and a bit line contact which interconnects the bit line and the bit line diffusion.

24. The process of claim 23 including the step of forming an erase path which extends from the curved side edge of each floating gate, through the tunnel oxide to an adjacent select gate by applying a relatively negative voltage to the control gate above the floating gate and a relatively positive voltage to the adjacent select gate.

25. The process of claim 23 including the step of forming a program path between one the floating gates and an underlying channel region in the substrate through which electrons can travel by hot carrier injection to build up a negative charge on the floating gate.

26. The process of claim 25 wherein the program path is formed by holding the bit line for the row at 0 volts, applying a relatively low positive voltage to the cell select gate adjacent to the floating gate, applying a relatively high positive voltage to the source diffusion at the end of the row opposite the row select gate, and applying a relatively high positive voltage to the control gate above the floating gate.

27. The process of claim 23 including the step of forming a program path between the control gate and an underlying channel region in the substrate by applying a relatively high positive voltage to the control gate above the floating gate, maintaining the bit line for the row at 0 volts, applying a relatively low positive voltage to the select gates, and maintaining the source diffusion at 0 volts, whereby a relatively strong electric field is created between the floating gate and the underlying channel region, which results in electron migration from the channel region to the floating gate.

28. In a NAND memory cell array: a silicon substrate having an active area, an oxide layer formed on the substrate above the active area, a plurality of relatively thin floating gates having the side edges with a rounded curvature above the oxide layer, a plurality of control gates positioned above and in vertical alignment with the floating gates and substantially thicker in vertical direction and narrower in horizontal direction than the floating gates, select gates adjacent to and self-aligned with the control gates at opposite ends of a row of gates, erase gates interposed between the control gates, a source diffusion region formed in the active region of the substrate beneath each of the erase gates, relatively thin tunnel oxides between the rounded side edges of the floating gates and the erase gates, relatively thick dielectric between the erase gates and the control gates, a relatively thick dielectric between each of the select gates and the adjacent control gate, a relatively thin dielectric between the select gate and the floating gate beneath the adjacent control gate, a thin dielectric film between each of the floating gates and the silicon substrates, relatively thick dielectric films between the select gates and the silicon substrate and between the each of the erase gates and the source diffusion region beneath it, a bit line diffusion region and a common source diffusion region partially underlying the select gates at opposite ends of the row, a bit line, and a bit line contact interconnecting the bit line and the bit line diffusion.

29. The NAND flash memory cell array of claim 28 wherein the select gate and the erase gates are self-aligned with and parallel to adjacent ones of the control gates.

30. The NAND flash memory cell array of claim 28 wherein an erase path is formed from the rounded side edge of one of the floating gates, through the tunnel oxide to an adjacent one of the erase gates by applying a relatively negative voltage to the control gate above the floating gate and a relatively positive voltage to the erase gate, with high voltage coupling between the control gate, the substrate and the floating gate.

31. The NAND flash memory cell array of claim 28 wherein a program path is formed by turning on the select transistor at the end of a row near the bit line contact and the stacked control and floating gate transistors for a cell, turning off the select translator near the common source, with the common source at 0 volts, applying a relatively negative voltage to the bit line diffusion and the silicon substrate, and applying a relatively positive voltage to the control gate, whereby the floating gate is charged with electrons by Fowler-Nordheim tunneling from a channel region in the substrate beneath the floating gate to the floating gate.

32. The NAND flash memory cell array of claim 28 wherein a read path is formed by turning on the select transistors and the stacked control and floating gate transistors in unselected cells, with the common source at 0 volts, the bit line diffusion at 1–3 volts, and the control gate at relatively high positive voltage, and the control gate of the selected cell is biased at 0 volts to form a conduction channel under the floating gate for an erase state and a non-conduction channel for a program state.

33. In a NAND flash memory cell array: a silicon substrate having an active area, an oxide layer formed on the substrate above the active area, a plurality of relatively thin floating gates having the side edges with a rounded curvature above the oxide layer, a plurality of control gates positioned above and in vertical alignment with the floating gates, the control gates being substantially thicker in vertical dimension and narrower in horizontal dimension than the underlying floating gates, row select gates adjacent to and self-aligned with the control gates at opposite ends of a row of gates, cell select gates interposed between the control gates, relatively thin tunnel oxides between the rounded side edges of the floating gates and the select gates, relatively thick dielectric between the select gates and the control gates, a thin dielectric between each of the floating gates and the silicon substrate, a relatively thick dielectric between the row select gate and the silicon substrate, a bit line diffusion region and a common source diffusion region partially underlying the select gates at opposite ends of the row, a bit line, and a bit line contact interconnecting the bit line and the bit line diffusion.

34. The NAND flash memory cell array of claim 33 wherein the cell select gates are self-aligned with and parallel to adjacent ones of the control gates.

35. In a NAND flash memory cell array: a silicon substrates having an active area, an oxide layer formed an the substrate above the active area, a plurality of relatively thin floating gates having the side edges with a rounded curvature above the oxide layer, a plurality of control gates positioned above and in vertical alignment with the floating gates, the control gates being substantially thicker in vertical dimension and narrower in horizontal dimension than the underlying floating gates, row select gates adjacent to and self-aligned with the control gates at opposite ends of a row of gates, cell select gates interposed between the control gates, relatively thin tunnel oxides between the rounded side edges of the floating gates and the select gates, relatively thick dielectric between the select gates and the control gates, a thin dielectric between each of the floating gates and the silicon substrate, a relatively thick dielectric between the row select gate and the silicon substrate, a bit line diffusion region and a common source diffusion region partially underlying the select gates at opposite ends of the row, a bit line, and a bit line contact interconnecting the bit line and the bit line diffusion, with a relatively negative voltage applied to the control gate of a selected cell, a relatively positive voltage applied to an adjacent one of the cell select gates, and high voltage coupling between the control gate and the floating gate beneath it and between the substrate and the floating gate to form an erase path from the rounded side edge of the floating gate, through the tunnel oxide to the adjacent cell select gate.

36. In a NAND flash memory cell array: a silicon substrate having an active area, an oxide layer formed on the substrate above the active area, a plurality of relatively thin floating gates having the side edges with a rounded curvature above the oxide layer, a plurality of control gates positioned above and in vertical alignment with the floating gates, the control gates being substantially thicker in vertical dimension and narrower in horizontal dimension than the underlying floating gates, row selected gates adjacent to and self-aligned with the control gates at opposite ends of a row of gates, cell select gates interposed between the control gates, relatively thin tunnel oxides between the rounded side edges of the floating gates and the select gates, relatively thick dielectric between the selected gates and the control gates, a thin dielectric between each of the floating gates and the silicon substracte, a bit line relatively thick dielectric between the row select gate and the silicon substrate, a bit line diffusion region and a common source diffusion region partially underlying the select gates at opposite ends of the row, a bit line, and a bit line contact interconnecting the bit line and the bit line diffusion, with the common source region at a relatively high positive voltage of 6–8 volts, the bit line diffusion at 0 volts, the control gates of unselected cells and the row select gates biased at 7–9 volts, the select gate adjacent to a selected cell biased at 1–2 volts, and a high voltage of about 10–12 volts applied to the control gate of a selected cell and coupled to the floating gate to form a program path between the floating gate and a channel region in the substrate between the floating gate and an adjacent one of the cell select gate in which electrons are transported from the channel region to the curved side edge of the floating gate by hot carrier injection.

37. In a NAND flash memory cell array: a silicon substrate having an active area, an oxide layer formed on the substrate above the active area, a plurality of relatively thin floating gates having the side edges with a rounded curvature above the oxide layer, a plurality of control gates positioned above and in vertical alignment with the floating gates, the control gates being substantially thicker in vertical dimension and narrower in horizontal dimension than the underlying floating gates, row select gates adjacent to and self-aligned with the control gates at opposite ends of a row of gates, cell select gates interposed between the control gates, relatively thin tunnel oxides between the rounded side edges of the floating gates and the select gates, relatively thick dielectric between the select gates and the control gates, a thin dielectric between each of the floating gates and the silicon substrate, a relatively thick dielectric between the row select gate and the silicon substrate, a bit line diffusion region and a common source diffusion region partially underlying the select gates at opposite ends of the row, a bit line, and a bit line contact interconnecting the bit line and the bit line diffusion, with a relatively negative voltage applied to the bit line diffusion and the silicon substrate, the row select gate near the common source turned off, the common source at 0 volts, and a relatively positive voltage applied to the control gate to form a program path in which the floating gate is charged with electrons by Fowler-Nordheim tunneling from a channel region in the substrate beneath the floating gate the floating gate.

38. In a NAND flash memory cell array: a silicon substrate having an active area, an oxide layer formed on the substrate above the active area, a plurality of relatively thin floating gates having the side edges with a rounded curvature above the oxide layer, a plurality of control gates positioned above and in vertical alignment with the floating gates, the control gates being substantially thicker in vertical dimension and narrower in horizontal dimension than the underlying floating gates, row select gates adjacent to and self-aligned with the control gates at opposite ends of a row of gates, cell select gates interposed between the control gates, relatively thin tunnel oxides between the rounded side edges of the floating gates and the select gates, relatively thick dielectric between the select gates and the control gates, a thin dielectric between each of the floating gates and the silicon substrate, a relatively thick dielectric between the row select gate and the silicon substrate, a bit line diffusion region and a common source diffusion region partially underlying the select gates at opposite ends of the row, a bit line, and a bit line contact interconnecting the bit line and the bit line diffusion, with the common source at 0 volts, the bit line diffusion at a voltage of 1–3 volts, and the control gate of a selected cell at 0 volts to form a conduction channel under the floating gate for an erase state and a non-conduction channel for a program state.

39. In a NAND flash memory cell array: a silicon substrate having an active area in which a plurality of shallow trenches formed, an oxide layer on the substrate and on the walls of the trenches, a plurality of relatively thin floating gates having side edges with a rounded curvature above the oxide layer, a plurality of control gates positioned above and in vertical alignment with the floating gates, the control gates being substantially thicker in vertical dimension and narrower in horizontal dimension than the floating gates, row select gates adjacent to and self-aligned with the control gates at opposite ends of a row of gates, cell select gates interposed between the control gates and extending into the trenches, relatively thin tunnel oxides between the rounded side edges of the floating gates and the select gates, relatively thick dielectric between the select gates and the control gates, a thin dielectric between each of the floating gates and the silicon substrate, a relatively thick dielectric between the row select gates and the silicon substrate, channel regions formed in the substrate between the trenches, source diffusion regions in the substrate beneath the trenches, a bit line diffusion region and a common source diffusion region partially underlying the row select gates at opposite ends of the row, a bit line, and a bit line contact interconnecting the bit line and the bit line diffusion.

40. The NAND flash memory cell array of claim 39 wherein the cell select gates are self-aligned with and parallel to adjacent ones of the control gates.

41. The NAND flash memory cell array of claim 39 wherein a relatively negative voltage is applied to the control gate of a selected cell and a relatively positive voltage is applied to an adjacent one of the cell select gates with high voltage coupling between the control gate and the floating gate beneath it and between the substrate and the floating gate, to form an erase path from the rounded side edge of the floating gate, through the tunnel oxide to the adjacent cell select gate.

42. The NAND flash memory cell array of claim 39 wherein a relatively negative voltage is applied to the bit line diffusion and the silicon substrate, the select gate near the common source is turned off, with the common source at 0 volts, and a relatively positive voltage is applied to the control gate, to form a program path in which the floating gate is charged with the electrons by Fowler-Nordheim tunneling from a channel region in the substrate beneath the floating gate to the floating gate.

43. The NAND flash memory cell array of claim 39 the common source region is maintained at a relatively high positive voltage of 6–8 volts, the bit line diffusion is maintained at 0 volts, the control gates of unselected cells and the row select gates are biased at 7–9 volts, the select gate adjacent to a selected cell is biased at 1–2 volts, and a high voltage of about 10–12 volts is applied to the control gate of a selected cell and coupled to the floating gate to form a program path between the floating gate and a channel region in the substrate between the floating gate and an adjacent one of the cell select gates in which electrons are transported from the channel region to the curved side edge of the floating gate by hot carrier injection.

44. The NAND flash memory cell array of claim 39 wherein the common source is maintained at 0 volts, the bit line diffusion is maintained at a voltage of 1–3 volts, and the control gate of a selected cell is biased at 0 volts to from a conduction channel under the floating gate of an erase state and non-conduction channel for a program state.

45. A NAND flash memory cell array, comprising: a substrate having an active area, a bit line diffusion and a source region positioned toward opposite sides of the active area, a plurality of memory cells arranged in a row between the bit line diffusion and the source region, with each of the memory cells having a control gate positioned above and aligned with a floating gate and a split gate adjacent to the stacked gates, a select gate at one end of the row partially overlapping the bit line diffusion, a bit line above the row, and a bit line contact interconnecting the bit line and the bit line diffusion.

46. The NAND flash memory cell array of claim 45 including a second select gate at the other end of the row partially overlapping source region.

47. The NAND flash memory cell array of claim 45 wherein the control gates are substantially thicker in vertical dimension and narrower in lateral dimension than the floating gates.

48. The memory cell array of claim 45 wherein the floating gates are relatively thin and have curved side edges, with relatively thin tunnel oxides between the curved side edges of the floating gates and adjacent ones of the split gates and the select gate.

49. The memory cell array of claim 45 including a relatively thin dielectric film between each of the floating gates and the substrate, a relatively thick dielectric between the select gate at the end of the row and the substrate, and a relatively thick dielectric beneath each of the split gates.

50. A NAND flash memory cell array, comprising: a substrate having an active area, a bit line diffusion and a source region spaced apart from each other toward opposite sides of the active area, a plurality of vertically stacked pairs of floating gates and control gates arranged in a row between the bit line diffusion and the source region, with the control gates being positioned above and aligned with the floating gates, split gates aligned with and positioned between the pairs of stacked gates, a select gate at one end of the row partially overlapping the bit line diffusion, a bit line above the row, a bit line contact interconnecting the bit line and the bit line diffusion, and erase paths extending from the side edges of the floating gates, through the tunnel oxides to the adjacent split and select gates.

51. A NAND flash memory cell array, comprising: a substrate having an active area, a bit line diffusion and a source region spaced apart from each other toward opposite sides of the active area, a plurality of vertically stacked pairs of floating gates and control gates arranged in a row between the bit line diffusion and the source region, with the control gates being positioned above and aligned with the floating gates, split gates aligned with and positioned between the pairs of stacked gates, a select gate at one end of the row partially overlapping the bit line diffusion, a bit line above the row, a bit line contact interconnecting the bit line and the bit line diffusion, and a program path comprising a gate oxide between one the floating gates and an underlying channel region in the substrate through which electrons can travel by hot carrier injection to build up a negative charge on the floating gate.

52. The memory cell array of claim 45 wherein the split gates are select gates.

53. A NAND flash memory cell array, comprising: a substrate having an active area, a bit line diffusion and a source region spaced apart from each other toward opposite sides of the active area, a plurality of vertically stacked pairs of floating gates and control gates arranged in a row between the bit line diffusion and the source region, with the control gates being positioned above and aligned with the floating gates, select gates positioned between the pairs of stacked gates extending into trenches in the substrate, a select gate at one end of the row partially overlapping the bit line diffusion, a bit line above the row, and a bit line contact interconnecting the bit line and the bit line diffusion.

54. The memory cell array of claim 53 including source diffusions in the substrate beneath the select gates in the trenches.

55. A NAND flash memory cell array, comprising: a substrate having an active area, a bit line diffusion and a source region spaced apart from each other toward opposite sides of the active area, a plurality of vertically stacked pairs of floating gates and control gates arranged in a row between the bit line diffusion and the source region, with the control gates being positioned above and aligned with the floating gates, erase gates aligned with and positioned between the pairs of stacked gates, source regions in the active area beneath the erase gates and partially underlying the floating gates, a select gate at one end of the row partially overlapping the bit line diffusion, a bit line above the row, and a bit line contact interconnecting the bit line and the bit line diffusion.

56. The memory cell array of claim 55 including a relatively thin dielectric film between each of the floating gates and the substrate, and relatively thick dielectrics between the select gate and the substrate and between the erase gates and the source regions.

57. The NAND flesh memory cell array of claim 13 wherein the row select gate partially overlaps the bit line diffusion.

58. A NAND flash memory cell array, comprising: a substrate having an active area, a plurality of vertically stacked pairs of floating gates and control gates arranged in rows above the active area, with the floating gates being relatively thin and having curved side edges and the control gates being positioned above the floating gates, a row select gate adjacent to the stacked gate at one of each row, cell select gates interposed between and aligned with the stacked gates in each row, a bit line above each row, a bit line diffusion and a common source diffusion in the active area at opposite ends of each row, with the row select gate partially overlapping the common source diffusion, a bit line contact interconnecting the bit line and the bit line diffusion in each row, and relatively thin tunnel oxides between the curved side edges of the floating gates and adjacent ones of the select gates.

59. A NAND flash memory cell array, comprising: a substrate having an active area, a plurality of vertically stacked pairs of floating gates and control gates arranged in rows above the active area, with the floating gates being relatively thin and having curved side edges and the control gates being positioned above the floating gates, a row select gate at each end of the row, with one of the row select gates overlapping the bit line diffusion and the other overlapping the common source diffusion, cell select gates interposed between and aligned with the stacked gates in each row, a bit line above each row, a bit line diffusion and a common source diffusion in the active area at opposite ends of each row.

60. A NAND flash memory cell array, comprising: a substrate having an active area, a plurality of vertically stacked pairs of floating gates and control gates arranged in rows above the active area, with the floating gates being relatively thin and having curved side edges and the control gates being positioned above the floating gates, split gates interposed between and aligned with the stacked gates in each row to form a series of memory cells each having a pair of stacked gates an a split gate adjacent to the stacked gates, a bit line diffusion and a common source diffusion in the active area at opposite ends of each row, a row select gate partially overlapping the bit line diffusion adjacent to the stacked gates at one end of each row, a bit line above each row, a bit line contact interconnecting the bit line and the bit line diffusion in each row, and relatively thin tunnel oxides between the curved side edges of the floating gates and adjacent ones of the split gates.

61. The NAND flash memory cell array of claim 60 including a second row select gate partially overlapping the common source diffusion adjacent to the stacked gates at the other end of each row.

62. The NAND flash memory cell array of claim 60 wherein the split gates are select gates.

63. The NAND flash memory cell array of claim 60 wherein the split gates are erase gates.

64. The NAND flash memory cell array of claim 60 including source regions in the active area beneath the split gates.

65. The NAND flash memory cell array of claim 60 wherein the split gates extend into trenches in the active area of the substrate between the stacked gates.

66. The NAND flash memory cell array of claim 60 wherein the control gates are thicker in vertical dimension and narrower in horizontal dimension than the floating gate.

67. The NAND flash memory cell array of claim 60 wherein the split gates are erase gates, and source diffusion regions are formed in the active region beneath the erase gates.

68. The NAND flash memory cell array of claim 67 including relatively thick dielectrics between the erase gates and the control gates, a relatively thick dielectric between the select gate and the control gate in the adjacent cell, a relatively thin dielectric between the select gate and the floating gate in the adjacent cell, a thin dielectric film between each of the floating gates and the substrate, and relatively thick dielectric films between the select gate and the substrate and between the erase gates and the source diffusion regions beneath them.

69. The NAND flash memory cell array of claim 60 wherein the split gates are cell select gates which extend into trenches in the active area of the substrate, with oxide layers between the cell select gates and the walls of the trenches, source diffusion regions in the substrate beneath the trenches, relatively thick dielectric between the select gates and the control gates, a thin dielectric between each of the floating gates and the substrate, a relatively thick dielectric between the row select gate and the substrate, and channel regions in the substrate between the trenches.

* * * * *